United States Patent
Nakabayashi et al.

(10) Patent No.: US 7,781,274 B2
(45) Date of Patent: Aug. 24, 2010

(54) MULTI-GATE FIELD EFFECT TRANSISTOR AND METHOD FOR MANUFACTURING THE SAME

(75) Inventors: Yukio Nakabayashi, Yokohama (JP); Ken Uchida, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/210,328

(22) Filed: Sep. 15, 2008

(65) Prior Publication Data

US 2009/0242986 A1    Oct. 1, 2009

(30) Foreign Application Priority Data

Mar. 27, 2008    (JP)    ............. 2008-083680

(51) Int. Cl.
*H01L 21/00*    (2006.01)
(52) U.S. Cl. .............. 438/157; 257/347; 257/E21.421; 257/E29.264; 438/149; 438/151
(58) Field of Classification Search ................ 257/347, 257/E21.421, E29.264; 438/157
See application file for complete search history.

(56) References Cited

U.S. PATENT DOCUMENTS

2007/0075351 A1    4/2007    Schulz et al.

FOREIGN PATENT DOCUMENTS

| JP | 2005-86024 | 3/2005 |
|---|---|---|
| JP | 2005086024 A * | 3/2005 |

* cited by examiner

*Primary Examiner*—Bradley K Smith
*Assistant Examiner*—Marvin Payen
(74) *Attorney, Agent, or Firm*—Oblon, Spivak, McClelland, Maier & Neustadt, L.L.P.

(57) ABSTRACT

A multi-gate field effect transistor includes: a plurality of semiconductor layers arranged in parallel on a substrate; source and drain regions formed in each of the semiconductor layers; channel regions each provided between the source region and the drain region in each of the semiconductor layers; protection films each provided on an upper face of each of the channel regions; gate insulating films each provided on both side faces of each of the channel regions; a plurality of gate electrodes provided on both side faces of each of the channel regions so as to interpose the gate insulating film, provided above the upper face of each of the channel region so as to interpose the protection film, and containing a metal element; a connecting portion connecting upper faces of the gate electrodes; and a gate wire connected to the connecting portion.

3 Claims, 32 Drawing Sheets

A-A' SECTION

B-B' SECTION

A-A' SECTION

B-B' SECTION

A-A' SECTION

B-B' SECTION

A-A' SECTION

B-B' SECTION

A-A' SECTION

A-A' SECTION

A-A' SECTION

A-A' SECTION

A-A' SECTION

B-B' SECTION

C-C' SECTION

D-D' SECTION

A-A' SECTION

B-B' SECTION

C-C' SECTION

D-D' SECTION

A-A' SECTION

B-B' SECTION

C-C' SECTION

D-D' SECTION

A-A' SECTION

B-B' SECTION

C-C' SECTION

D-D' SECTION

A-A' SECTION

B-B' SECTION

C-C' SECTION

D-D' SECTION

A-A' SECTION

B-B' SECTION

C-C' SECTION

D-D' SECTION

A-A' SECTION

B-B' SECTION

C-C' SECTION

D-D' SECTION

A-A' SECTION

B-B' SECTION

C-C' SECTION

D-D' SECTION

A-A' SECTION

A-A' SECTION

A-A' SECTION

A-A' SECTION

B-B' SECTION

C-C' SECTION

D-D' SECTION

A-A' SECTION

B-B' SECTION

C-C' SECTION

D-D' SECTION

A-A' SECTION

B-B' SECTION

C-C' SECTION

D-D' SECTION

A-A' SECTION

US 7,781,274 B2

MULTI-GATE FIELD EFFECT TRANSISTOR AND METHOD FOR MANUFACTURING THE SAME

CROSS-REFERENCE TO RELATED APPLICATION

This application is based upon and claims the benefit of priority from prior Japanese Patent Application No. 2008-83680 filed on Mar. 27, 2008 in Japan, the entire contents of which are incorporated herein by reference.

BACKGROUND OF THE INVENTION

1. Field of the Invention

The present invention relates to a multi-gate field effect transistor and a method for manufacturing the multi-gate field effect transistor.

2. Related Art

Highly-integrated LSIs with high performances have been achieved by reducing the sizes of field effect transistors (FETs) as the fundamental elements of LSIs and improving the performances of those field effect transistors. The performance of each FET is determined by how high the driving current is during an ON operation and how low the leakage current from the channel is in an OFF state. According to the International Semiconductor Roadmap, novel techniques for realizing higher driving current and lower leakage current are necessary after the 45-nm generation.

To reduce the leakage current, fully-depleted (FD) devices each having its channel region fully depleted are expected as the next-generation fundamental devices, as the FD devices have high resistance to short channel effects. Particularly, attention is drawn to multi-gate field effect transistors among those devices. For example, a multi-gate field effect transistor has such a structure that a very small channel region is surrounded by gate electrodes, which is different from a single-gate field effect transistor that controls the potential in the channel from one direction only by a gate electrode formed on the surface of the channel as disclosed in JP-A 2005-86024 (KOKAI). The advantages of this structure are that the potential controllability in the channel region is made higher, a reduction of the potential barrier due to the shorter channel of each device is prevented, and the leakage current caused in an OFF state is lowered.

Here, controlling the threshold value of each device is essential. A FD device characteristically has inversion charges generated at a lower voltage than in a case of a bulk-type device. Therefore, if a conventional gate electrode material is used in a FD device, the leakage current in an OFF state (at 0 volt) becomes too high, and a new gate electrode material is required. At present, such gate electrodes include a type that uses a metal as a gate electrode (a metal gate), and a type that uses a compound of a metal and a semiconductor. The former is referred to a metal gate, the latter is referred to a silicide gate when the semiconductor is silicon and the compound is a silicide.

In a case where a metal gate and a silicide gate are used in a three-dimensional multi-gate field effect transistor, problems are caused in the manufacturing process. Particularly, metal contamination is always the biggest problem. To achieve a very small gate length, a flat surface is necessary when lithographic patterning is performed before the gate electrode is processed. However, the metal used in the metal gate or the silicide gate might enter the base semiconductor (such as silicon) or the gate insulating film, and the metal might become the center of carrier recoupling, charge traps, or a leakage current path. As a result, the device performance is greatly degraded. Therefore, flattening cannot be performed directly on the metal gate electrode or the silicide electrode by CMP (Chemical Mechanical Polishing). Also, the existence of a natural oxide film becomes a problem when a gate electrode is silicided. However, by any conventional manufacturing method, the natural oxide film cannot be removed.

SUMMARY OF THE INVENTION

The present invention has been made in view of these circumstances, and an object thereof is to provide a multi-gate field effect transistor that can prevent metal contamination even if a flattening process is carried out, and a method for manufacturing the multi-gate field effect transistor.

A method for manufacturing a multi-gate field effect transistor according to a first aspect of the present invention includes: forming a plurality of semiconductor layers in parallel on a substrate; forming a protection film on an upper face of each semiconductor layer; forming a first insulating layer on the semiconductor layers, the first insulating layer covering side faces of each semiconductor layer and covering side faces and an upper face of the protection film; forming a first interlayer insulating film on an entire surface and flattening the first interlayer insulating film to expose an upper face of each first insulating layer; removing the first insulating layers to form a plurality of holes at locations from which the first insulating layers are removed; forming a gate insulating film on both side faces of each semiconductor layer inside the holes; depositing a first polysilicon film on an entire surface to fill the holes; flattening the first polysilicon film to divide the first polysilicon film into a plurality of second polysilicon films and expose an upper face of the first interlayer insulating film; forming masks having shapes of gate electrodes on the second polysilicon films; patterning the second polysilicon films with the use of the masks; forming sidewalls made of an insulator so that the sidewalls sandwich the patterned second polysilicon films in a gate length direction; patterning the protection film with the use of the masks and the sidewalls to selectively expose an upper face of each of the semiconductor layers; implanting an impurity into the selectively exposed semiconductor layers to form source and drain regions; removing the masks to expose an upper face of each second polysilicon film; turning each of the second polysilicon films into a silicide, the second polysilicon films each having the upper face exposed; forming a second interlayer insulating film on an entire surface, forming an opening continuing to each of the silicides, and filling the opening to form a metal connecting portion connecting the silicides; and forming a wire connected to the connecting portion.

A method for manufacturing a multi-gate field effect transistor according to a second aspect of the present invention includes: forming a plurality of semiconductor layers in parallel on a substrate; forming a protection film on an upper face of each semiconductor layer; forming a first insulating layer on the semiconductor layers, the first insulating layer covering side faces of each semiconductor layer and side faces and an upper face of the protection film; forming a first interlayer insulating film on an entire surface and flattening the first interlayer insulating film to expose an upper face of each first insulating layer; removing the first insulating layers to form a plurality of holes at locations from which the first insulating layers are removed; forming a gate insulating film on both side faces of each semiconductor layer inside the holes; forming a gate metal film to cover side faces and a bottom face of each hole, the gate insulating film, and the protection film inside the holes; forming a polysilicon film to cover the gate metal film; etching the polysilicon film and the gate metal film existing in each hole, so as not to expose the gate metal film on the protection film; depositing again a polysilicon film to fill each hole; flattening the polysilicon film to divide the polysilicon film into a plurality of polysilicon layers and expose an upper face of the first interlayer insulating film; forming masks having shapes of gate electrodes on the polysilicon layers; patterning the polysilicon layers with the use of the masks; forming sidewalls made of an insulator so that the sidewalls sandwich the patterned polysilicon layers in a gate length direction; patterning the protection film with the use of the sidewalls to selectively expose an upper face of each semiconductor layer; implanting an impurity into the selectively exposed semiconductor layers to form source and drain regions; removing the masks to expose an upper face of each polysilicon layer; forming a second interlayer insulating film on an entire surface, forming an opening continuing to each of the polysilicon layers on the second interlayer insulating film, and filling the opening to form a metal connecting portion connecting the polysilicon layers; and forming a wire connected to the connecting portion.

A multi-gate field effect transistor according to a third aspect of the present invention includes: a plurality of semiconductor layers of a first conductivity type arranged in parallel on a substrate; source and drain regions of a second conductivity type formed at a distance from each other in each of the semiconductor layers; channel regions each provided between the source region and the drain region in each of the semiconductor layers; protection films each provided on an upper face of each of the channel regions; gate insulating films each provided on both side faces of each of the channel regions; a plurality of gate electrodes provided on both side faces of each of the channel regions so as to interpose the gate insulating film therebetween, provided above the upper face of each of the channel region so as to interpose the protection film therebetween, and containing a metal element; an interlayer insulating film provided on the substrate so as to cover side faces of each of the gate electrodes; a connecting portion connecting upper faces of the gate electrodes; and a gate wire connected to the connecting portion.

DETAILED DESCRIPTION OF THE INVENTION

Referring to FIGS. 1A to 5B, the problems with conventional multi-gate field effect transistors are described in detail to clarify the characteristics of a multi-gate field effect transistor in accordance with an embodiment of the present invention, before the multi-gate field effect transistor is described. Although the problems with n-type channel transistors are described in the following, the same problems as below are found in p-type channel transistors.

Figure 1A:
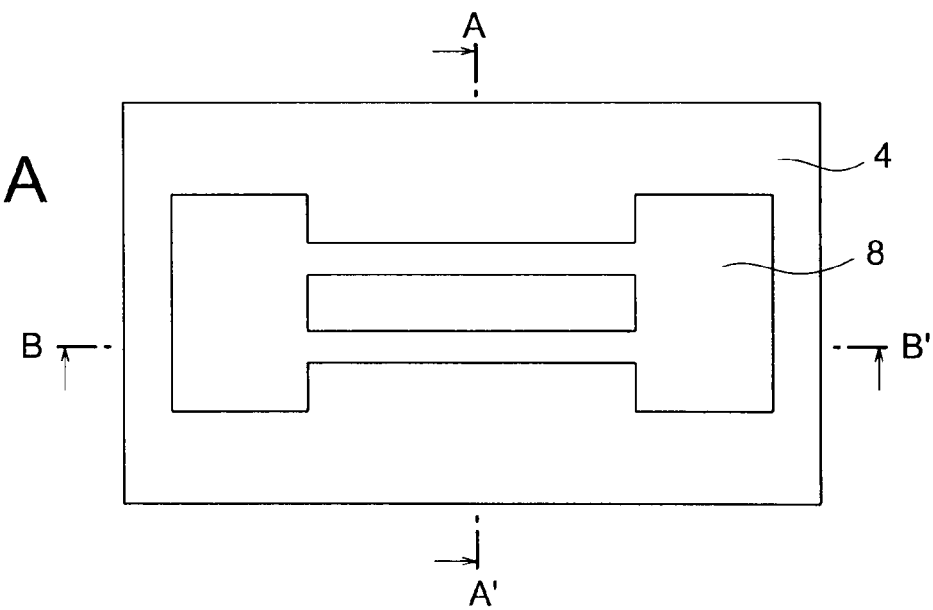
FIGS. 1A to 3C illustrate the procedures for manufacturing a conventional multi-gate FET.
Figure 1B:
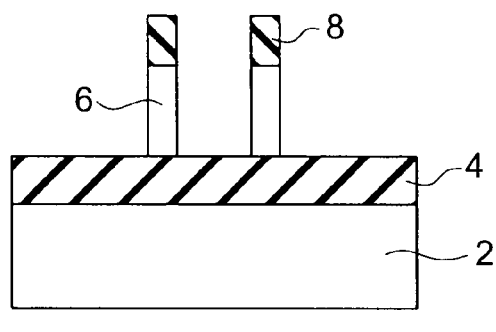
Figure 1C:
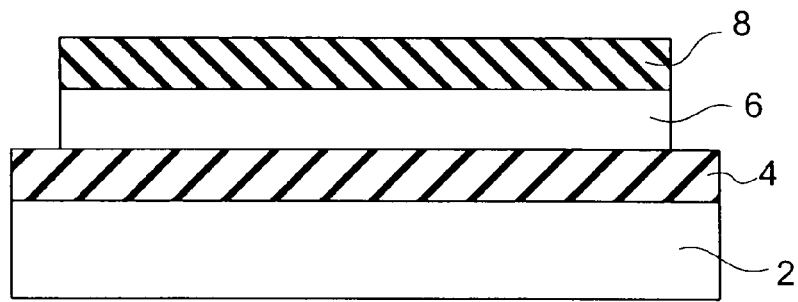

As shown in FIGS. 1A, 1B, and 1C, an insulating film 4 is formed on a supporting substrate 2, and a SOI layer 6 is formed on the insulating film 4 to form a SOI substrate. A 100-nm thick silicon nitride film as a protection film 8 for the channel is deposited on the SOI substrate by LPCVD (Low Pressure Chemical Vapor Deposition) or the like, and device isolation is performed by a known device isolating technique. Further, patterning is performed on the SOI layer 6 by a known patterning technique, so as to form the channel. The channel width is 20 nm, for example. FIG. 1A is a plan view of this structure. FIG. 1B is a cross-sectional view of the structure, taken along the line A-A' of FIG. 1A. FIG. 1C is a cross-sectional view of the structure, taken along the line B-B' of FIG. 1A.

Figure 2A:
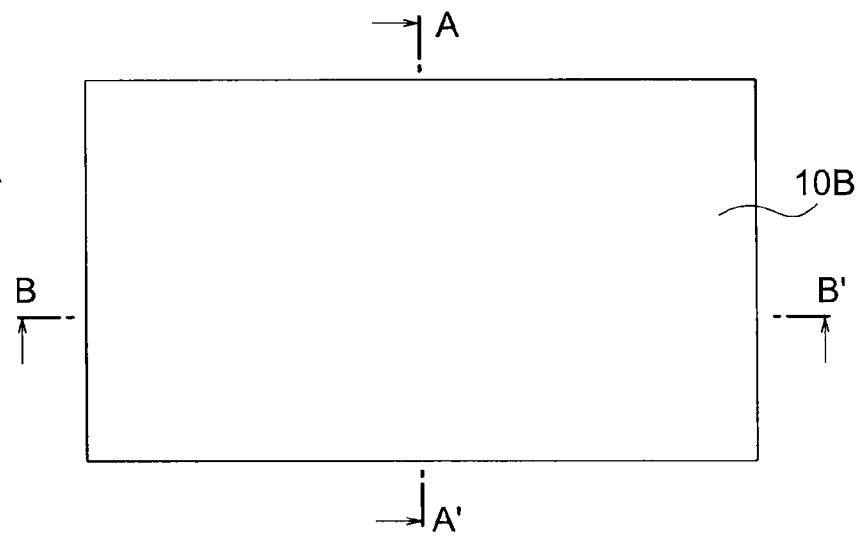
Figure 2B:
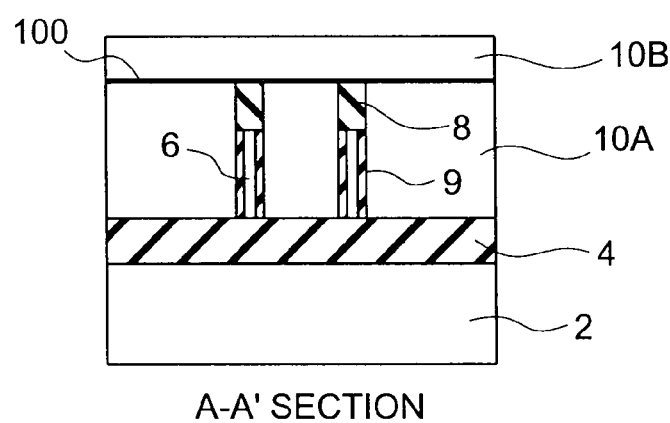
Figure 2C:
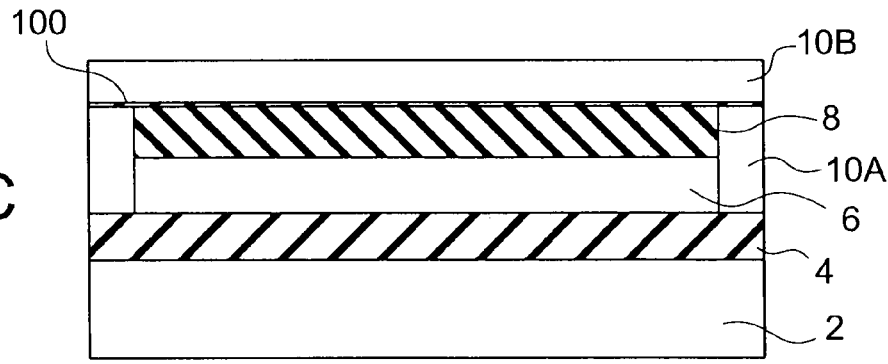

As shown in FIGS. 2A, 2B, and 2C, a 1-nm thick silicon dioxide film is formed as a gate insulating film 9 by RTO (Rapid Thermal Oxidation) or the like, and plasma nitridation is then performed to increase the dielectric constant. A 250-nm thick polysilicon film 10A to be a gate electrode is deposited by LPCVD or the like. To flatten the surface, CMP is performed with the silicon nitride film 8 serving as an etching stopper, so as to deposit a 60-nm thick polysilicon film 10B. At this point, a natural oxide film 100 is formed on the surface of the polysilicon film 10A. FIG. 2A is a plan view of this structure. FIG. 2B is a cross-sectional view of the structure, taken along the line A-A' of FIG. 2A. FIG. 2C is a cross-sectional view of the structure, taken along the line B-B' of FIG. 2A.

Figure 3A:
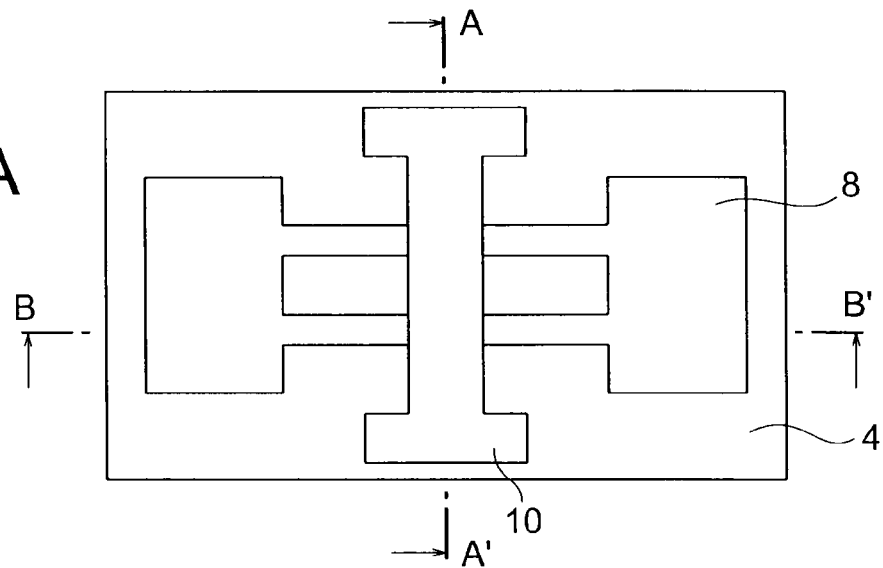
Figure 3B:
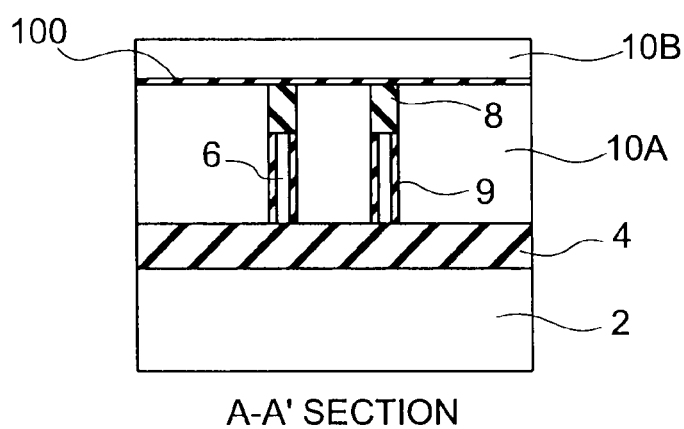
Figure 3C:
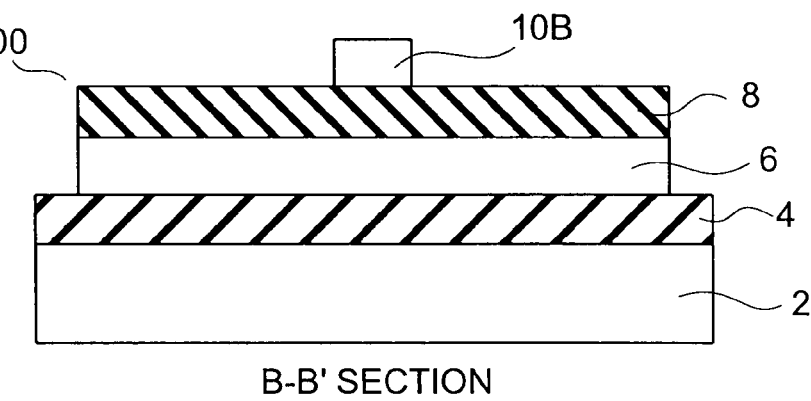

As shown in FIGS. 3A, 3B, and 3C, a hard mask layer (not shown) formed with a silicon nitride film is deposited on the structure. Patterning is then performed on the hard mask layer by a photolithography technique or the like. With the patterned hard mask layer serving as a mask, patterning is performed on the polysilicon film 10B by RIE or the like, so as to form a gate electrode portion. Here, an offset spacer may be further formed, but is not shown in the drawings.

Figure 4A:
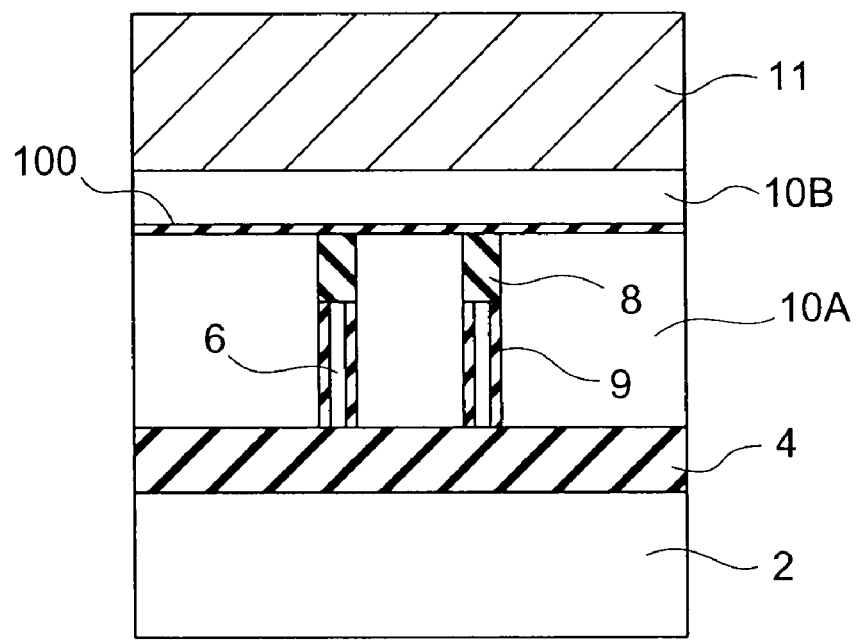
FIGS. 4A to 5B illustrate the problems with the procedures for manufacturing the conventional multi-gate FET.
Figure 4B:
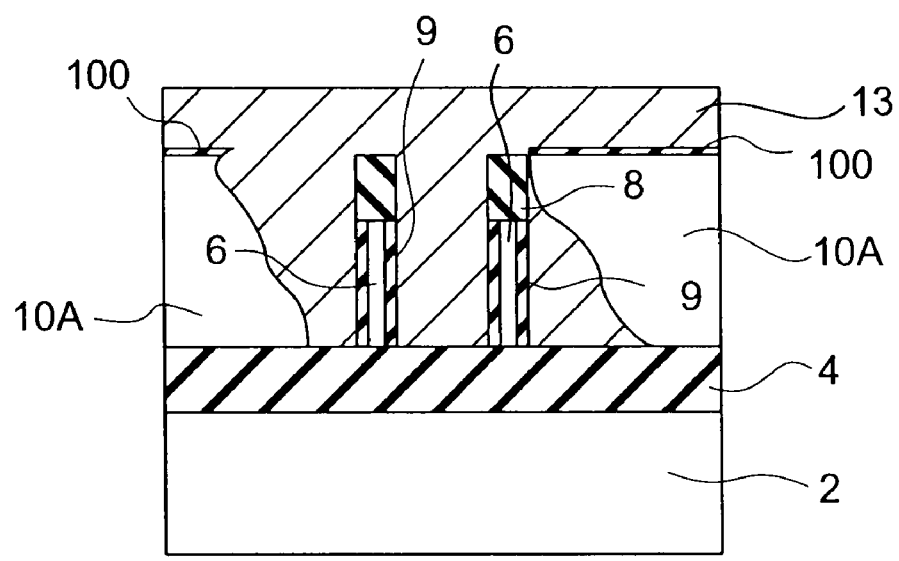

To perform patterning to form a gate electrode having a gate length of 50 nm or less by a photolithography technique, a flat surface is necessary. Therefore, the CMP procedure illustrated in FIGS. 2A, 2B, and 2C is carried out. However, if a fully-silicided gate or a metal gate is to be formed by CMP, a problem is caused during the procedure. For example, in the case of a fully-silicided gate, a metal (such as Ni) 11 is deposited on the polysilicon film 10B by sputtering, and a heat treatment is carried out at a temperature between 400° C. and 500° C. to silicide the polysilicon film 10B, as shown in FIG. 4A. However, since the natural oxide film 100 is not uniformly formed, as shown in FIG. 4B, the natural oxide film 100 becomes the barrier against diffusion of the metal 11 in the regions having the natural oxide film 100 formed therein, and the siliciding reaction in the region of the polysilicon film 10A located lower than the natural oxide film 100 becomes uneven. As a result, the polysilicon film 10A is divided into a portion 13 to be the silicide and a portion to remain the polysilicon film 10A, as shown in FIG. 4B. In this case, in the transistor having the channel 6 on the left-hand side in FIG. 4B, the silicide 13 exists on either side of the channel 6, and accordingly, the threshold values on both sides of the channel 6 are the same. However, in the transistor having the channel 6 on the right-hand side, the silicide 13 exists on the left side of the channel 6, but the polysilicon film 10A exists on the right side of the channel 6. Therefore, the threshold values are different from each other by the difference between the work functions of polysilicon and silicide.

In a LSI, variations among the threshold values of transistors become a serious problem. Therefore, the different threshold values of the channels of the respective transistors are a critical problem.

Furthermore, in such a situation, the resistances of the gate electrodes also vary, causing trouble during a high-frequency operation.

Figure 5A:
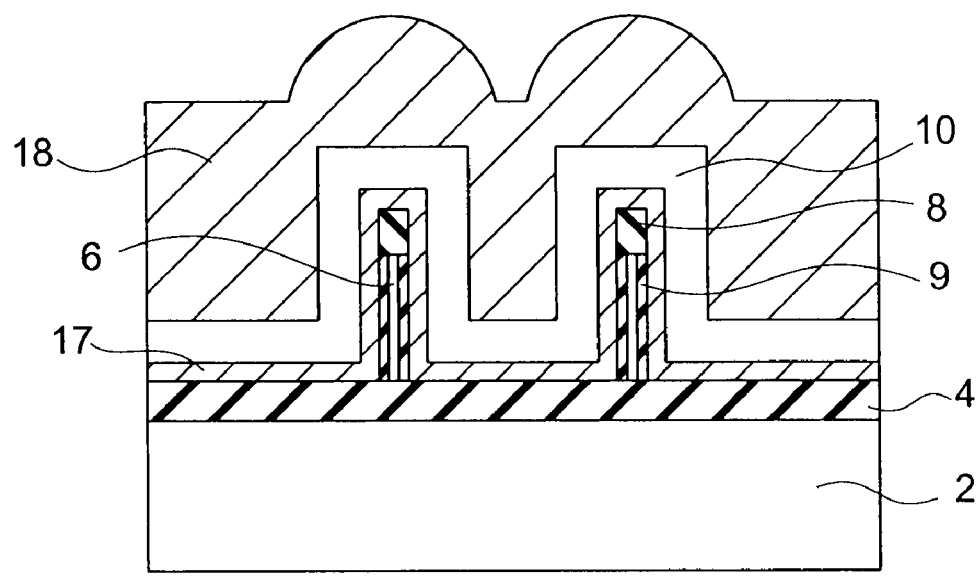
Figure 5B:
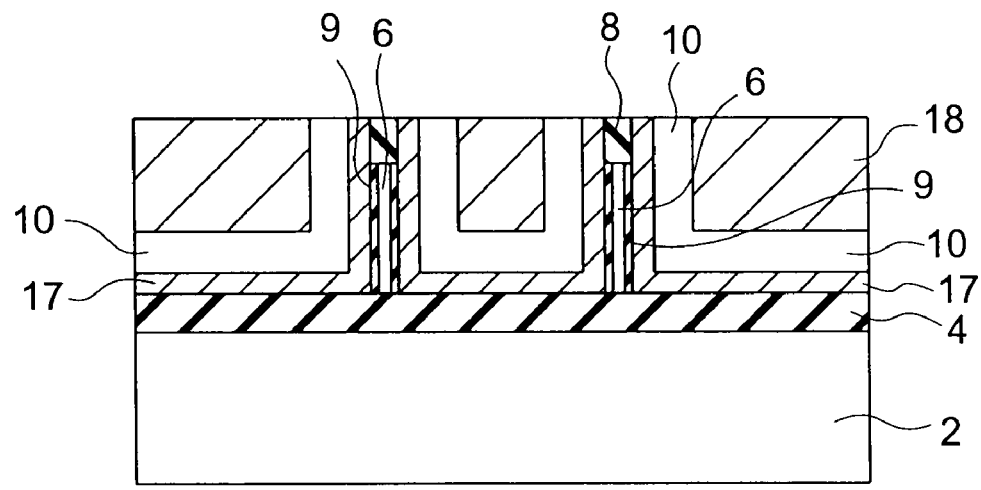

In a case where the gate electrode is made of a metal, on the other hand, a metal electrode 17 and a polysilicon film 10 are deposited to surround a semiconductor layer 6 to be the channel region. An interlayer insulating film 18 is then deposited. As a result, the upper face of the interlayer insulating film 18 becomes uneven. Therefore, to perform fine lithographic patterning, it is necessary to flatten the surface, as shown in FIG. 5B. In the flattening, only the silicon nitride film 8 serves as the stopper when the CMP procedure is carried out. As a result, the metal electrode 17 is also etched. As the metal electrode 17 is etched by CMP, the particles of the metal are scattered about on the entire wafer surface, and the wafer is contaminated with the metal. This is not allowable in the manufacture of LSIs. Therefore, in a case where a metal gate is used, lithographic patterning needs to be performed to form the gate electrode, without a flattening process. As a result, a small-sized gate cannot be formed.

The inventors made an intensive study to solve those problems, and developed multi-gate field effect transistors. The multi-gate field effect transistors are described below as embodiments of the present invention.

First Embodiment

Figure 6:
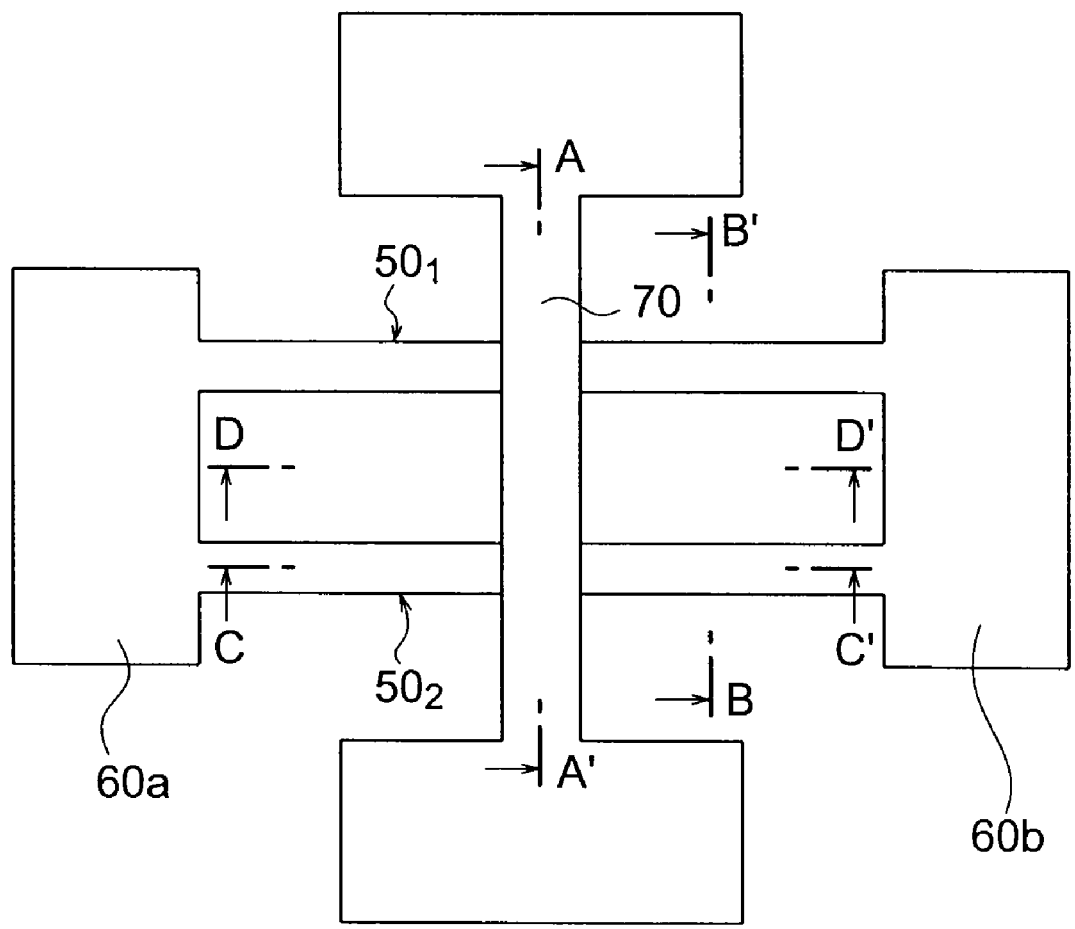
FIG. 6 is a plan view of a multi-gate FET in accordance with a first embodiment of the present invention.
Figure 7A:
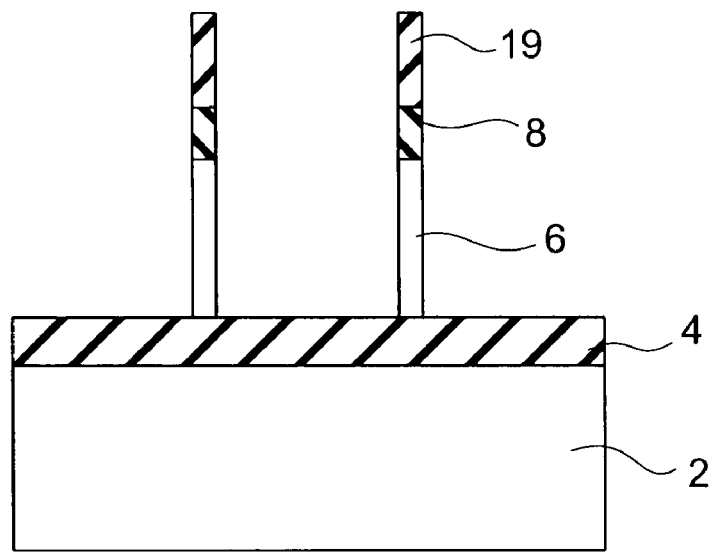
FIGS. 7A to 17 are cross-sectional views illustrating the procedures for manufacturing the multi-gate FET in accordance with the first embodiment.
Figure 7B:
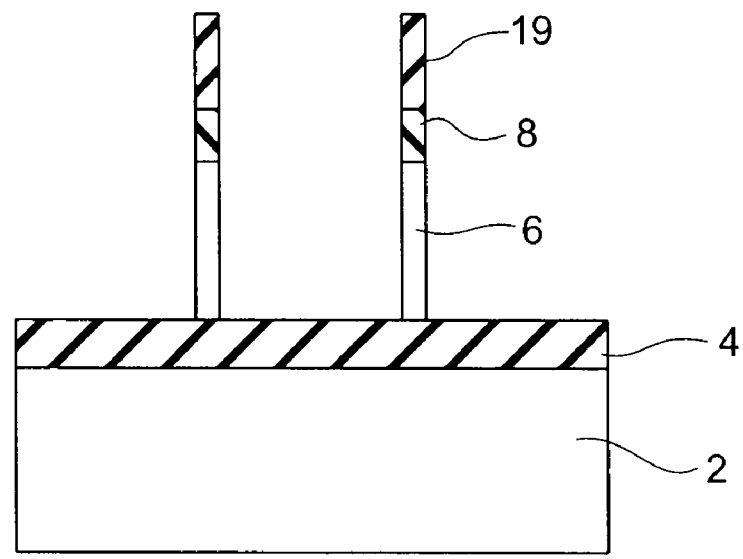
Figure 7C:
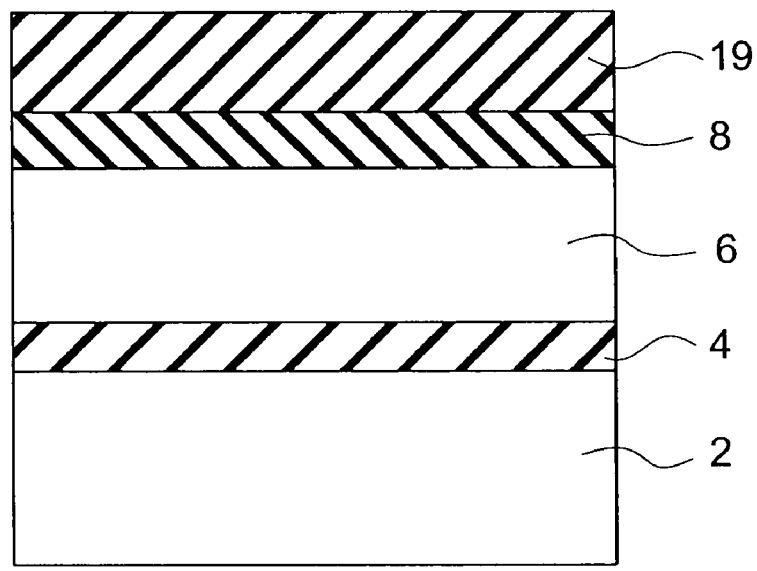
Figure 7D:
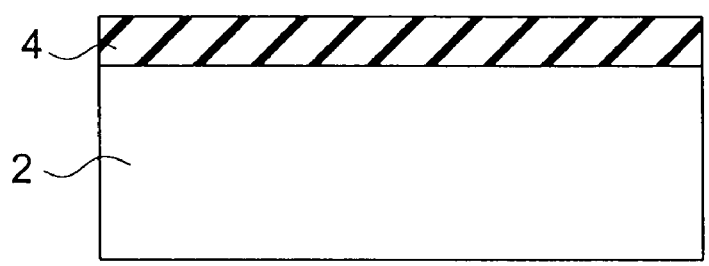
Figure 8A:
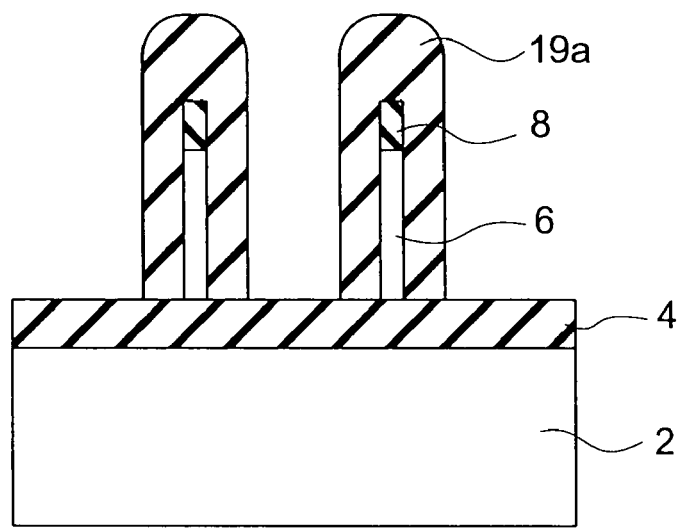
Figure 8B:
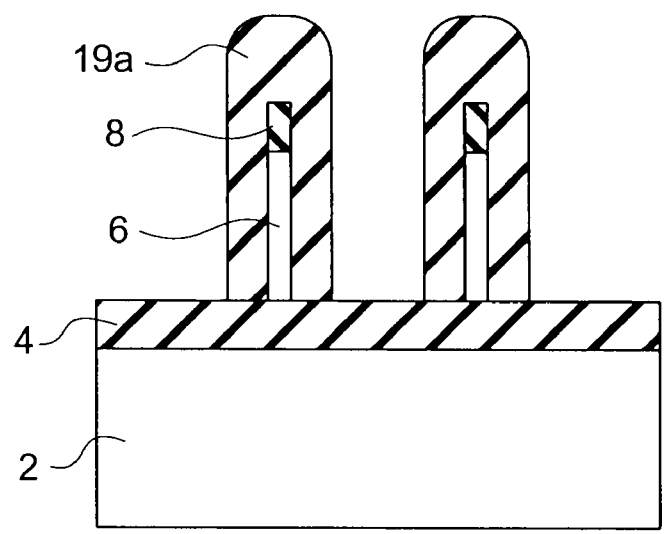
Figure 8C:
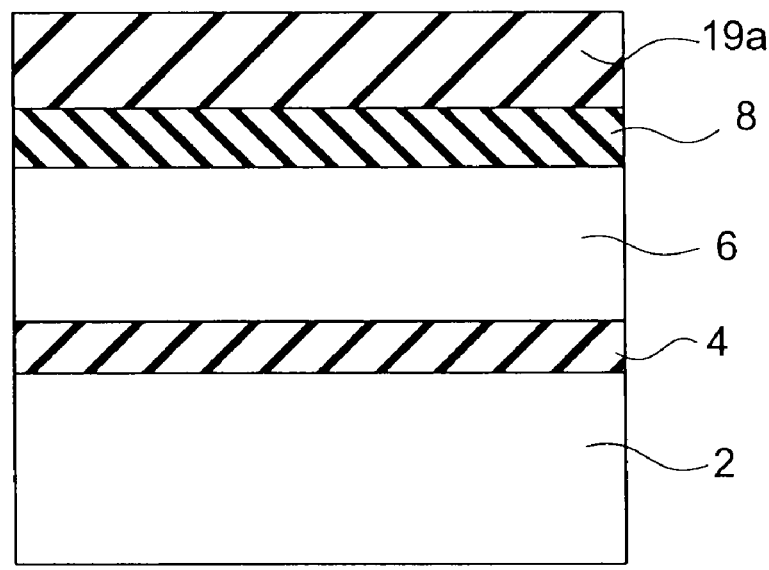
Figure 8D:
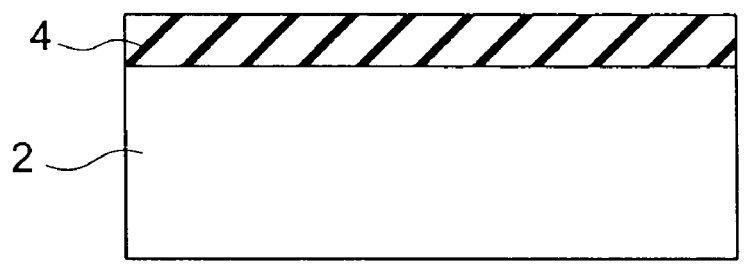
Figure 9A:
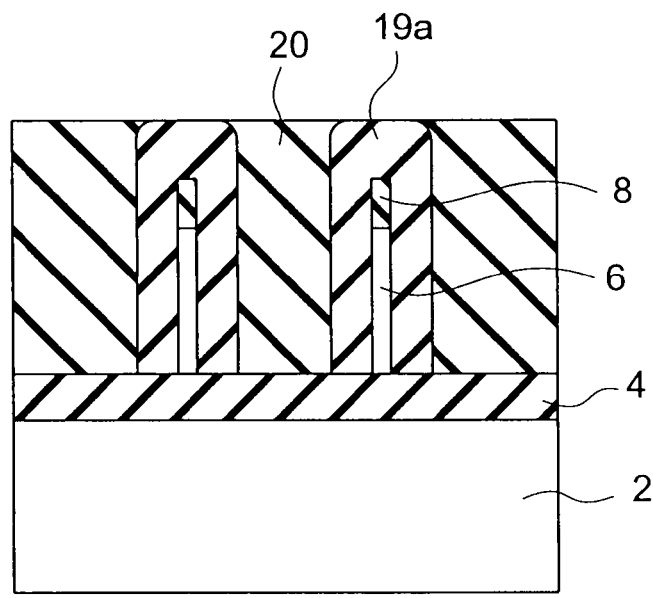
Figure 9B:
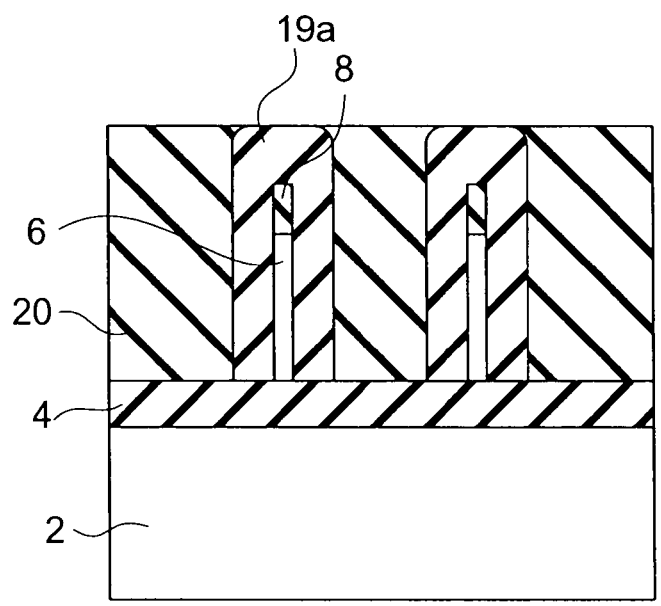
Figure 9C:
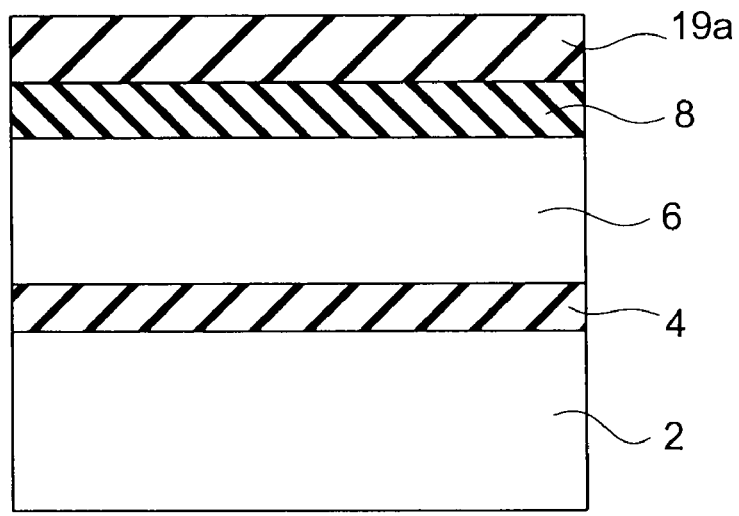
Figure 9D:
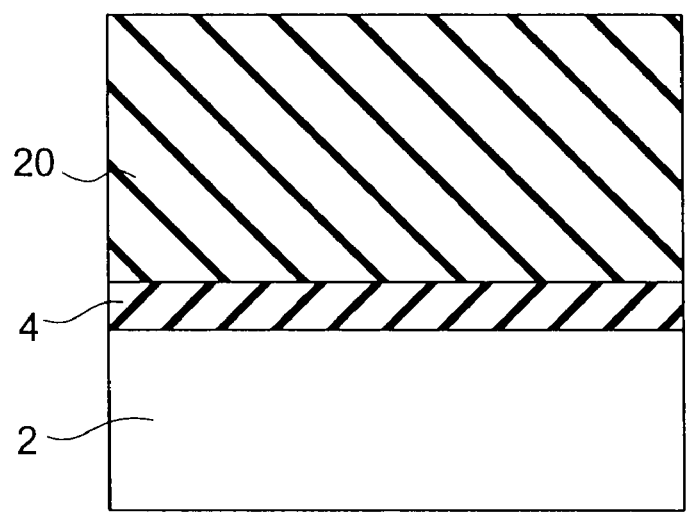
Figure 10A:
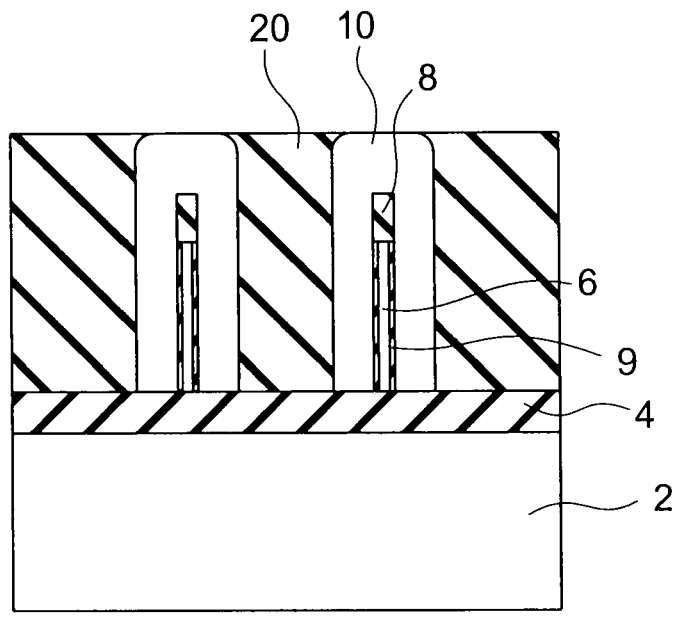
Figure 10B:
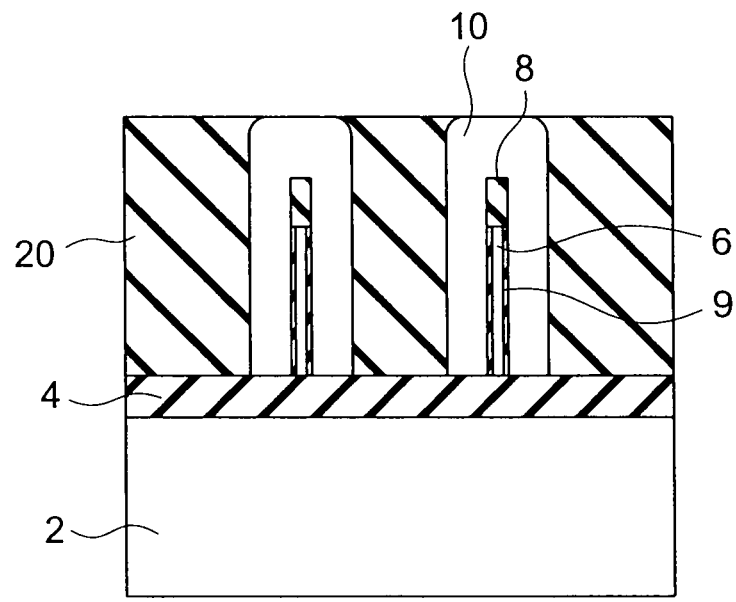
Figure 10C:
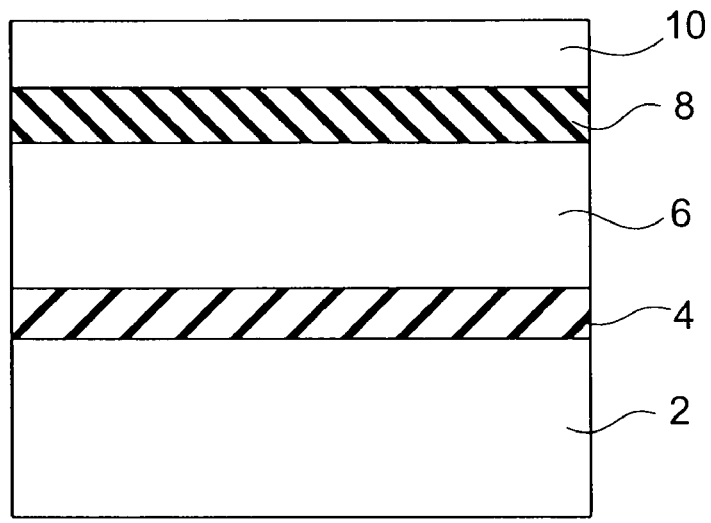
Figure 10D:
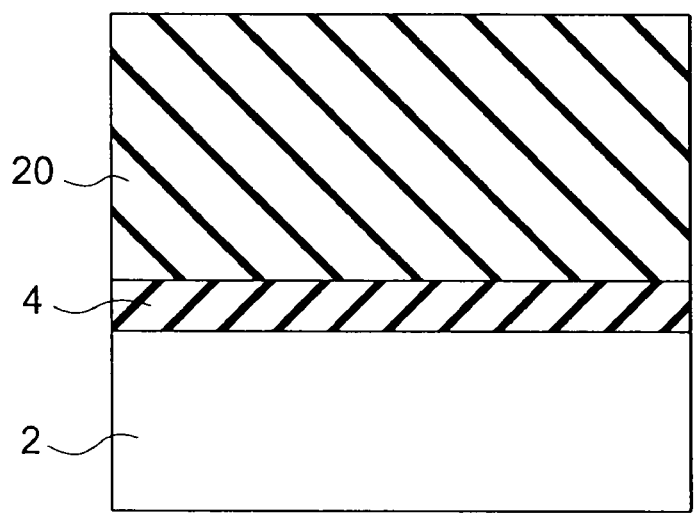

FIG. 6 is a plan view of a multi-gate field effect transistor in accordance with a first embodiment of the present invention. As shown in FIG. 6, the multi-gate field effect transistor of this embodiment includes two fins $50_1$ and $50_2$, an n-type source region 60a formed at one end of each of those fins, an n-type drain region 60b formed at the other end of each of those fins, and a gate 70 formed to bridge the two fins $50_1$ and $50_2$. Each of the fins $50_1$ and $50_2$ includes a p-type semiconductor layer to be the channel region, a gate insulating film formed on the side faces of the channel region, and a protection film formed on the upper face of the semiconductor layer. An n-type semiconductor layer is formed on the portion of the semiconductor layer located on either side of the channel region of each fin. The n-type semiconductor layer is connected to the n-type source region 60a or the n-type drain region 60b, and is also called the n-type source region 60a or the n-type drain region 60b. The gate 70 is formed to cover the gate insulating film on the channel region.

Referring now to FIGS. 7A to 19D, a method for manufacturing the multi-gate field effect transistor of this embodiment is described. In this embodiment, an n-type channel field effect transistor is described. However, a p-type channel field effect transistor can be produced in the same manner as below, if ion species to be used for ion implantation are changed. FIGS. 7A, 8A, 9A, 10A, 11A, 12A, 13A, 14A, 15, 16, 17, 18, and 19A are cross-sectional views of the multi-gate field effect transistor, taken along the line A-A' of FIG. 6. FIGS. 7B, 8B, 9B, 10B, 11B, 12B, 13B, 14B, and 19B are cross-sectional views of the multi-gate field effect transistor, taken along the line B-B' of FIG. 6. FIGS. 7C, 8C, 9C, 10C, 11C, 12C, 13C, 14C, and 19C are cross-sectional views of the multi-gate field effect transistor, taken along the line C-C' of FIG. 6. FIGS. 7D, 8D, 9D, 10D, 11D, 12D, 13D, 14D, and 19D are cross-sectional views of the multi-gate field effect transistor, taken along the line D-D' of FIG. 6.

First, as shown in FIGS. 7A, 7B, 7C, and 7D, an insulating film 4 is formed on a supporting substrate 2, and a SOI layer 6 is formed on the insulating film, to complete a SOI substrate. A 100-nm thick silicon nitride film is deposited as a protection film 8 on the SOI substrate by LPCVD (Low Pressure Chemical Vapor Deposition) or the like, and an insulating film 19 made of TEOS (Tetra Ethyl Ortho Silicate) or the like is deposited on the protection film 8. After that, device isolation is performed by a known device isolating technique. Further, patterning is performed on the SOI layer 6 by a known patterning technique, so as to form the channels. The width of each channel is 20 nm, for example. Here, the protection film 8 and the insulating film 19 exist on the upper face of each channel 6.

As shown in FIGS. 8A, 8B, 8C, and 8D, an insulating film 19 is further deposited, and etching is performed on the insulating film 19 by RIE (Reactive Ion Etching), so as to form sidewalls 19a formed from the insulating film 19 on the side faces of each channel 6 and each protection film 8. The insulating film 19 to be the sidewalls 19a also covers the upper face of each protection film 8. Those procedures are repeated several time, so that the width of the sidewalls 19a (the thickness of each sidewall from the corresponding side face of the channel 6 in a direction perpendicular to the side face of the channel 6) is maximized (50 nm to 100 nm, for example), and the height (the height from each protection film 8) is also maximized (300 nm, for example). Here, the insulating film 19a to be the sidewalls has round upper faces.

As shown in FIGS. 9A, 9B, 9C, and 9D, an insulating film 20 is deposited to cover the insulating film 19a to be the sidewalls. The insulating film 20 is then flattened by CMP, so as to expose the upper faces of the insulating film 19a. Here, the etching of the insulating film 19a is not stopped at the upper faces, but over-etching is performed to shave off the round top portions of the insulating film 19a and widen the opening portions.

As shown in FIGS. 10A, 10B, 10C, and 10D, the insulating film 19a covering the side faces and the upper faces of the channels 6 and the protection films 8 is completely removed by etching with the use of a liquid solution or the like, and holes are formed. If a diluted HF solution or the like is used, the insulating film 4 is also slightly etched. However, in a case where the insulating film 4 has a thickness of 1 μm, for example, the difference in etching rate between the TEOS (the material of the insulating film 19a) and the silicon thermally-oxidized film (the insulating film 4) is utilized to adjust the etching time. In this manner, the remaining insulating film 4 can have a sufficient thickness. After that, with the holes being formed, a 1-nm thick silicon dioxide film to be a gate insulating film 9 is formed on the side faces of each channel region 6 by RTO, for example. Plasma nitridation is then performed to increase the dielectric constant of the gate insulating film 9. Further, a polysilicon film 10 to be a gate electrode is deposited by LPCVD or the like. Here, the furnace temperature of LPCVD is set at a low temperature, and polysilicon is deposited through a rate-limiting reaction, so as to completely fill the holes. This is because, if deposition is performed at a high temperature, a polysilicon film is formed through a rate-limiting supply of the raw material, and the polysilicon film is formed preferentially on the insulating film 20, resulting in voids remaining in the holes. After that, the polysilicon film 10 is flattened by CMP, so as to obtain a flat surface suitable for the gate lithographic patterning.

As shown in FIGS. 11A, 11B, 11C, and 11D, a gate mask material is deposited, and patterning is performed on the gate mask material by a lithography technique, so as to form a mask 21.

Figure 11A:
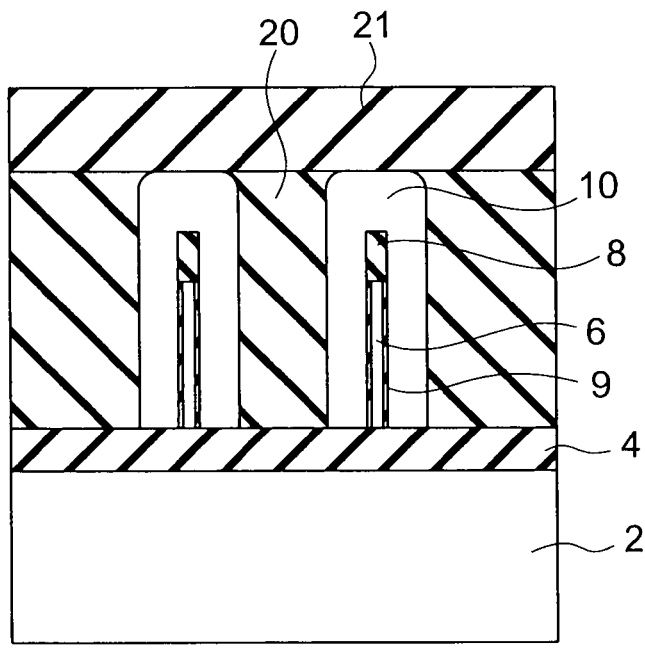
Figure 11B:
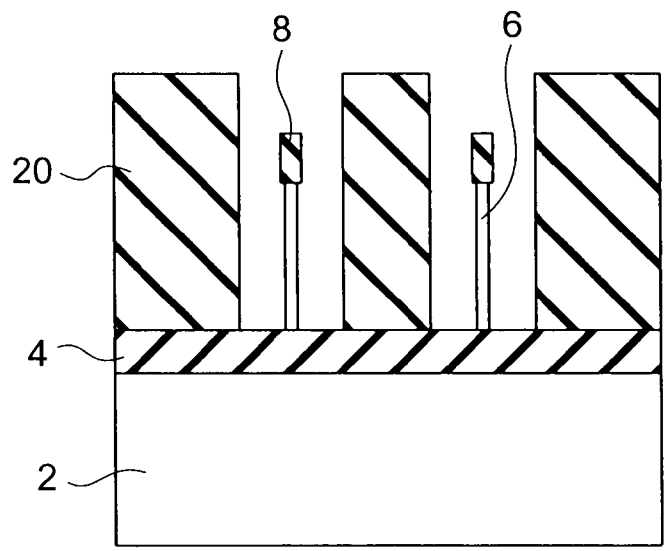
Figure 11C:
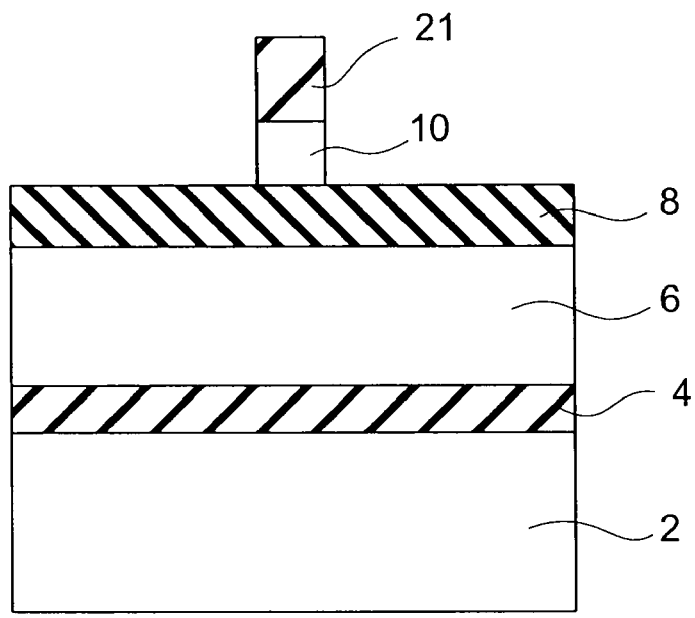
Figure 11D:
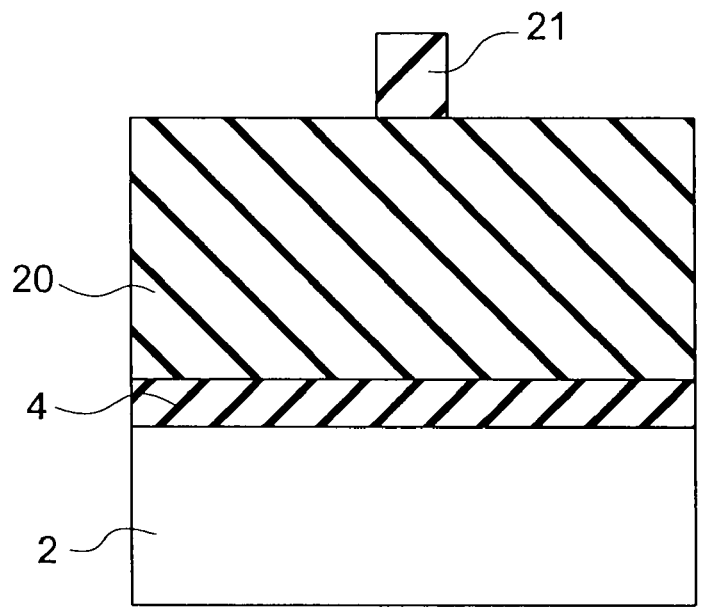

After that, with the use of the mask 21, patterning and slimming is performed on the polysilicon film 10, so as to form the polysilicon film 10 into the shape of a gate electrode. Here, the polysilicon film 10 and the gate insulating film 9 existing on the semiconductor layers 6 to be the source and drain regions are removed by RIE (FIGS. 11B and 11C).

Figure 12A:
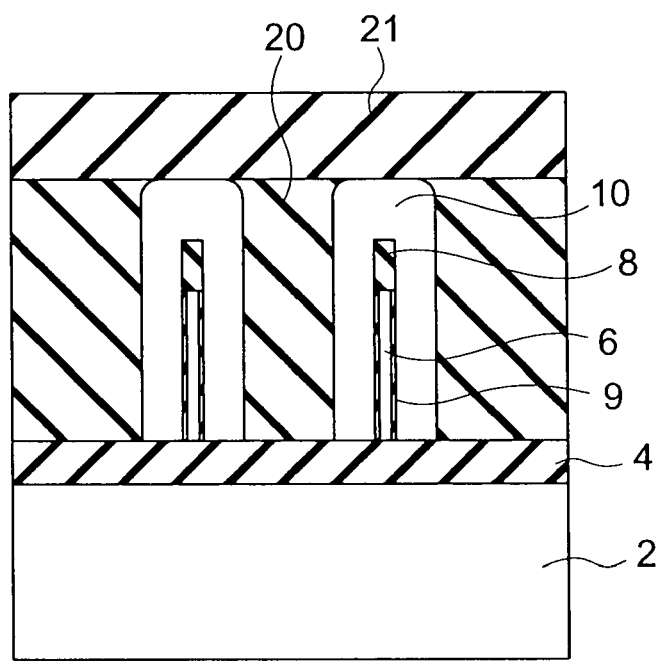
Figure 12B:
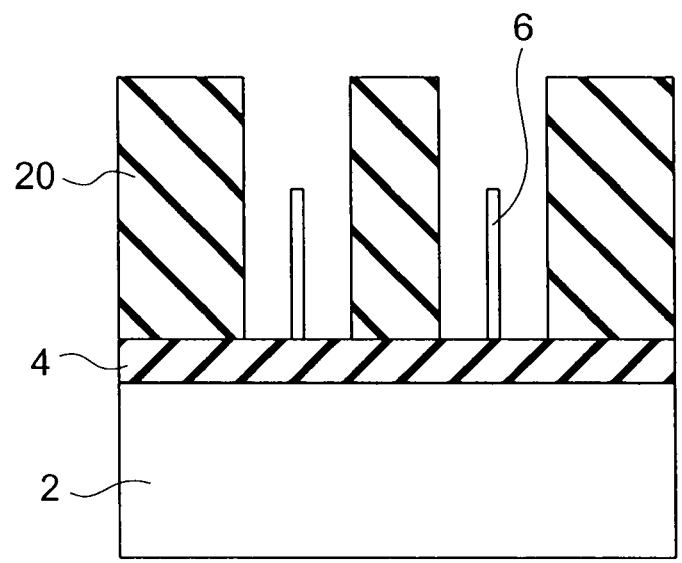
Figure 12C:
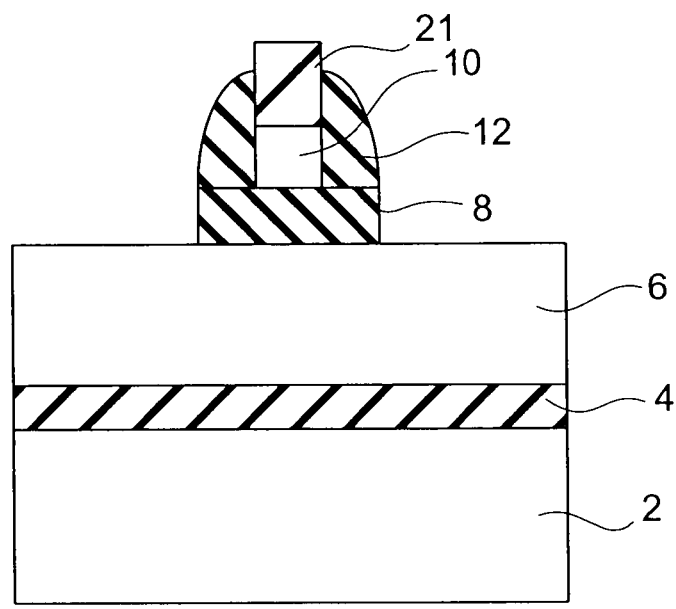
Figure 12D:
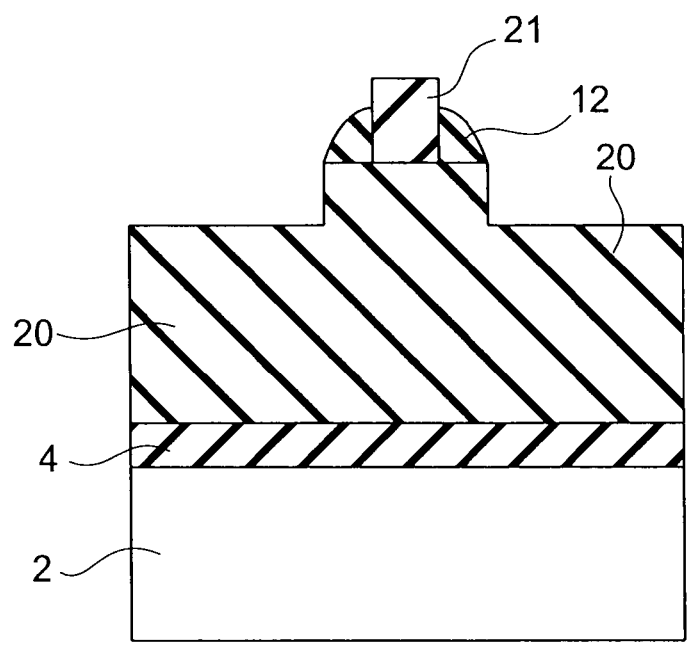

A gate sidewall material 12 made of SiN or the like is then deposited on the entire surface. After that, RIE is performed on the gate sidewall material 12, so as to form sidewalls 12 at the side portions of the polysilicon film 10 (FIGS. 12C and 12D). Here, over-etching is performed, so that the sidewalls of the polysilicon film 10 remain (FIG. 12C), but the sidewalls of the semiconductor layers 6 to be the source and drain regions are removed (FIG. 12B), due to the difference in height between the gate electrode 10 and each of the semiconductor layers 6 to be the source and drain regions. Also, the channel protection film 8 on each of the semiconductor layers 6 to be the source and drain regions is removed by the over-etching, so that the semiconductor layers 6 to be the source and drain regions are exposed (FIGS. 12B and 12C). By the over-etching, the insulating film 20 is recess-etched in the regions not covered with the mask 12, and the height of the insulating film 20 is reduced, as shown in FIG. 12D.

Figure 13A:
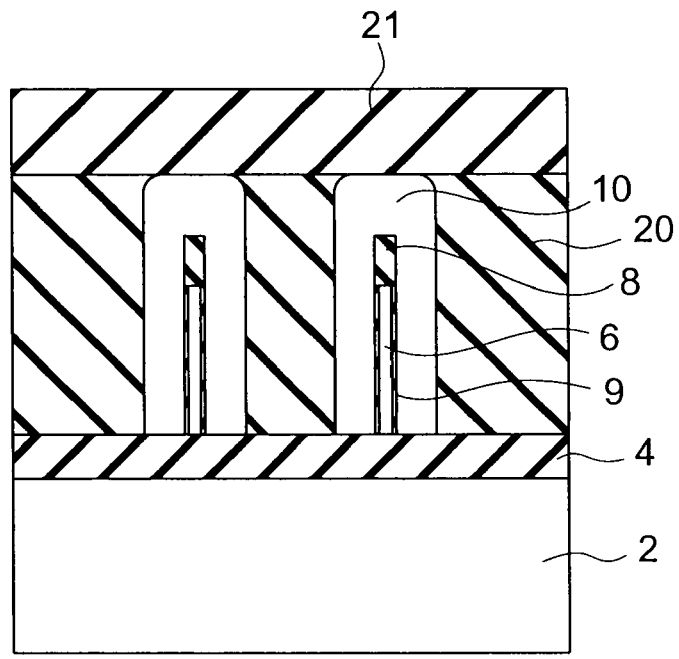
Figure 13B:
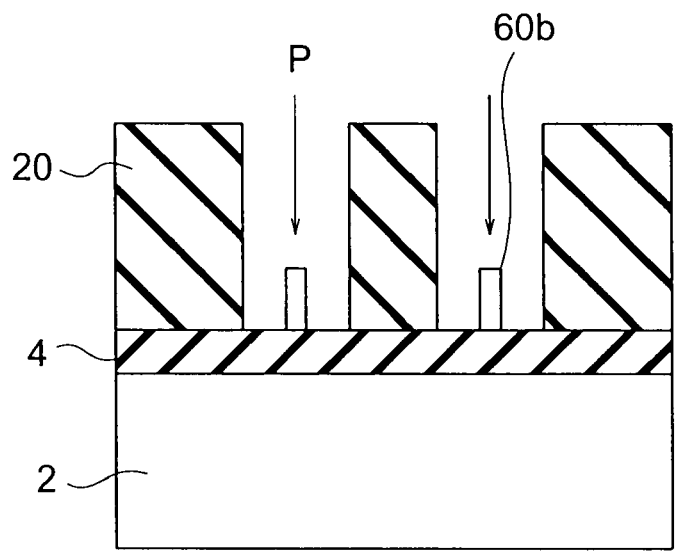
Figure 13C:
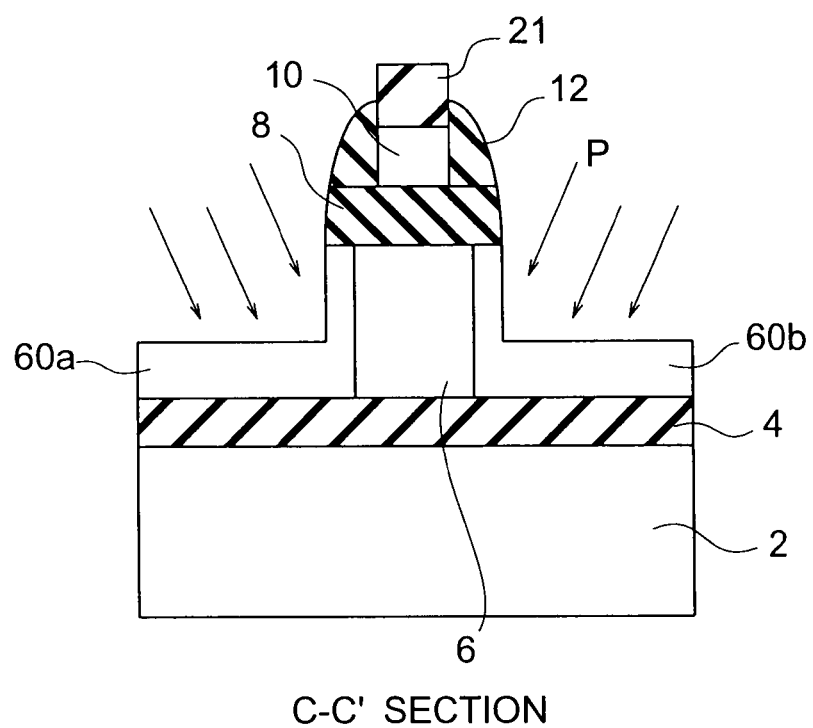
Figure 13D:
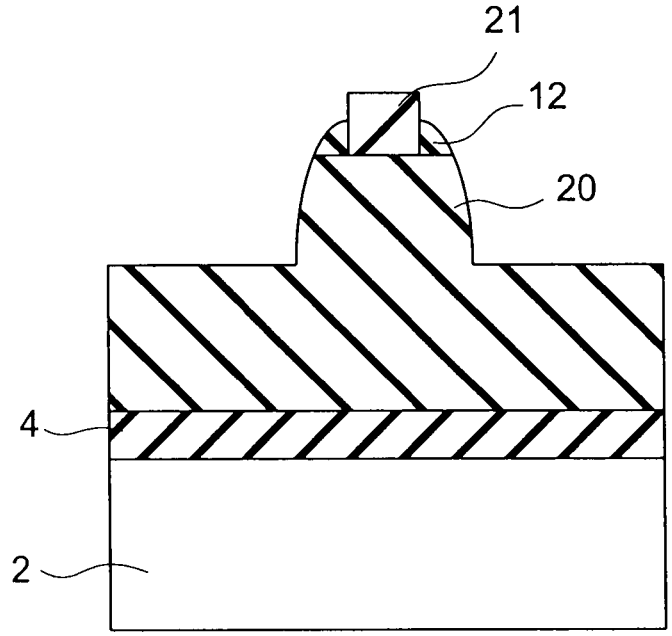

As shown in FIGS. 13B and 13C, selective etching is performed on the exposed semiconductor layers 6, with the sidewalls 12 serving as masks. In this manner, the height of each of the semiconductor layers 6 measured from the insulating film 4 is reduced. Phosphorus (P) ions as the dopant for forming the n-type source and drain regions are implanted from a diagonal direction at an angle of 7 degrees or more with respect to the direction perpendicular to the film plane (FIG. 13C). By doing so, the n-type source region 60a and the n-type drain region 60b are formed, and each p-type semiconductor region 6 between the source region 60a and the drain region 60b becomes the channel region. Here, the mask 21 is not removed, as shown in FIGS. 13A, 13C, and 13D. If p-type source and drain regions are to be formed, boron (B) is used as the dopant.

Figure 14A:
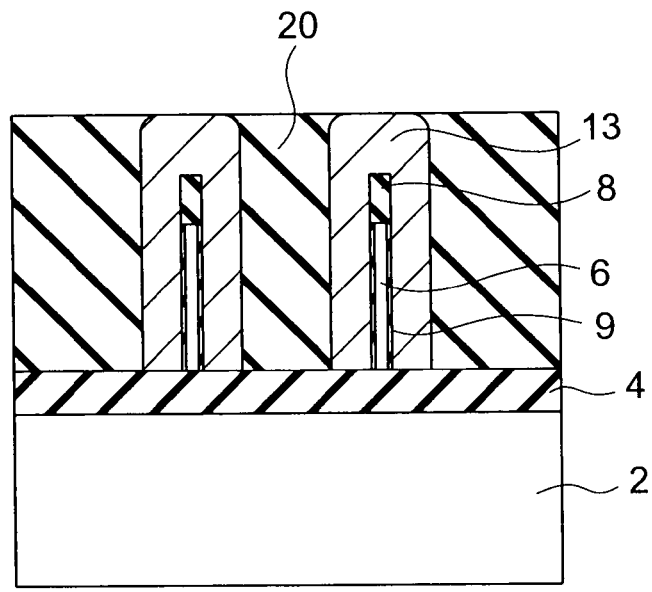
Figure 14B:
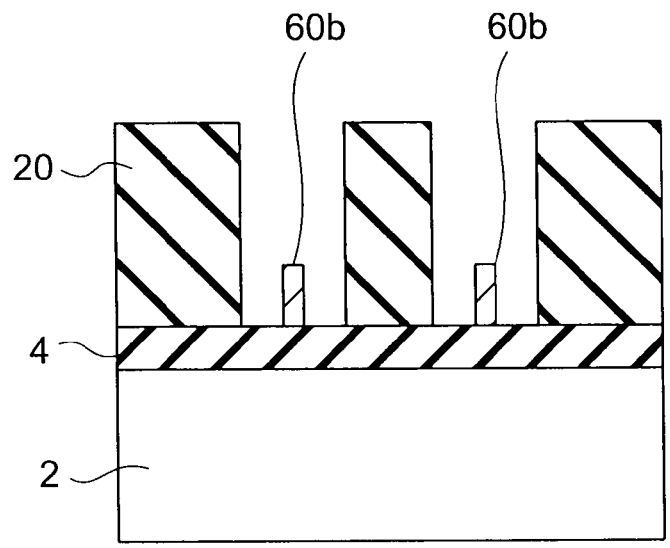
Figure 14C:
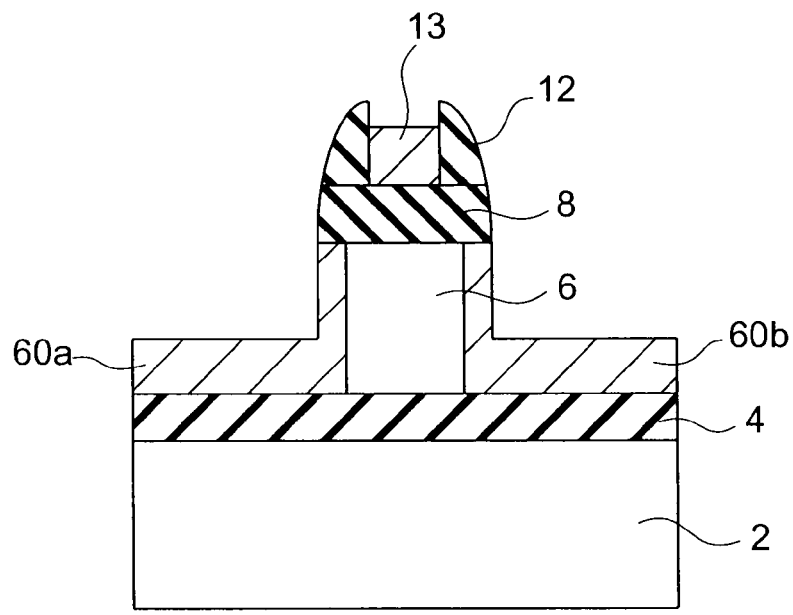
Figure 14D:
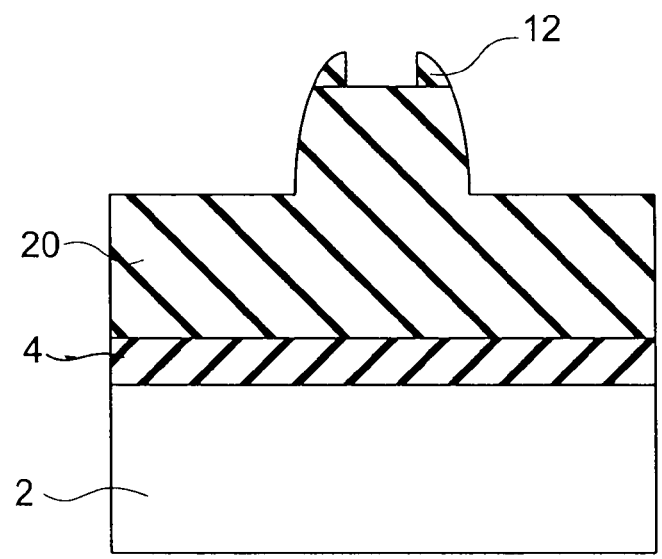

As shown in FIGS. 14A, 14B, 14C, and 14D, after the gate mask 21 is removed, metal sputtering using Ni and a heat treatment are performed, so as to fully silicide the polysilicon film 10. In this manner, gate electrodes 13 are formed. Since a natural oxide film does not exist on the polysilicon film 10, uniform Ni diffusion is caused, and the entire gate electrodes 13 are fully silicided. At the same time, the source region 60a and the drain region 60b are also silicided (FIGS. 14B and 14C).

Figure 15:
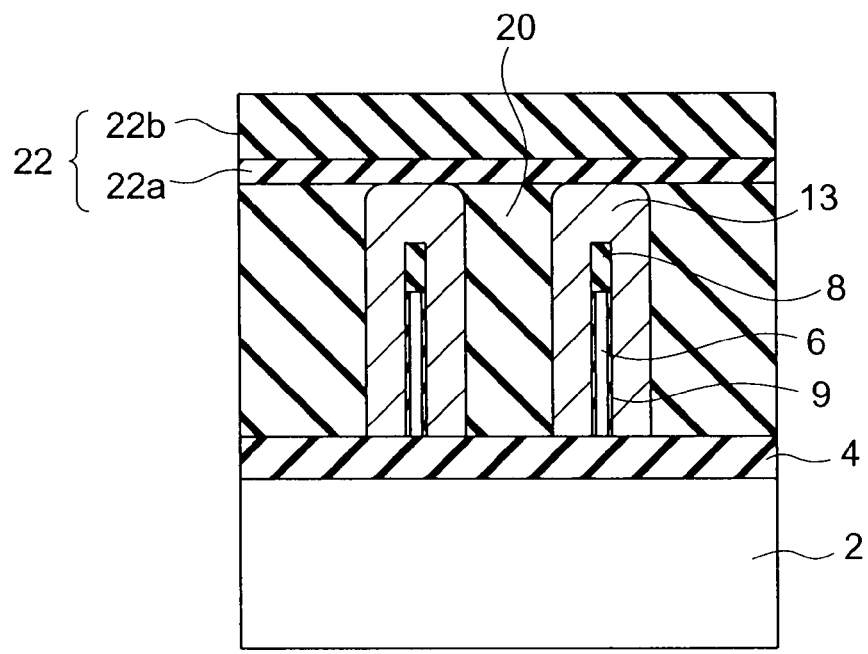

In this situation, as shown in FIG. 14A, the gate electrode 13 is divided into two, and a voltage cannot be applied to the gate electrodes 13. Therefore, it is necessary to connect the gate electrodes 13 with an upper-layer wire. After the siliciding procedure illustrated in FIGS. 14A to 14D is completed, a SiN film 22a of several tens of nanometers is deposited as the contact etching stopper. An interlayer insulating film 22b is then deposited on the SiN film 22a, and flattening is performed by CMP (FIG. 15). Even if the concavities and convexities of the upper face of the interlayer insulating film 22b are large before CMP is performed, the SiN film 22a serves as the etching stopper during the CMP.

Figure 16:
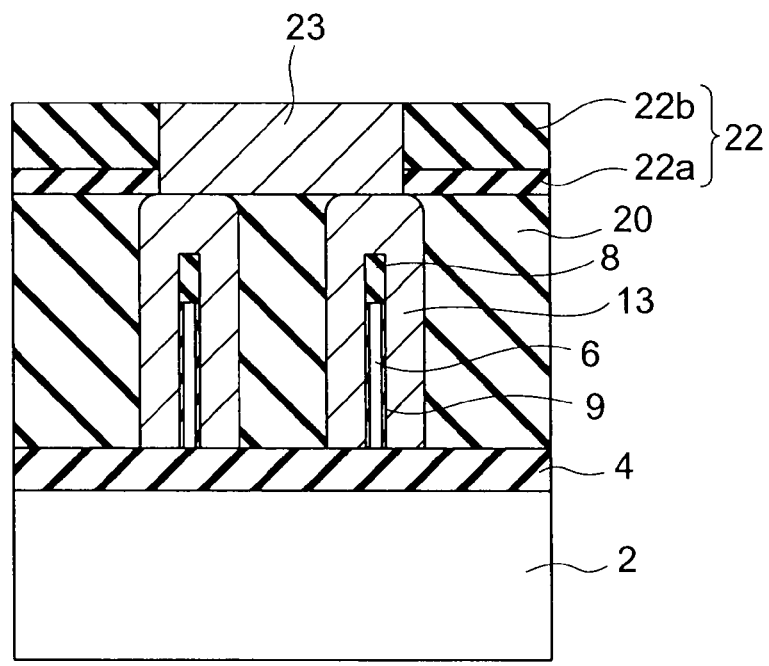
Figure 17:
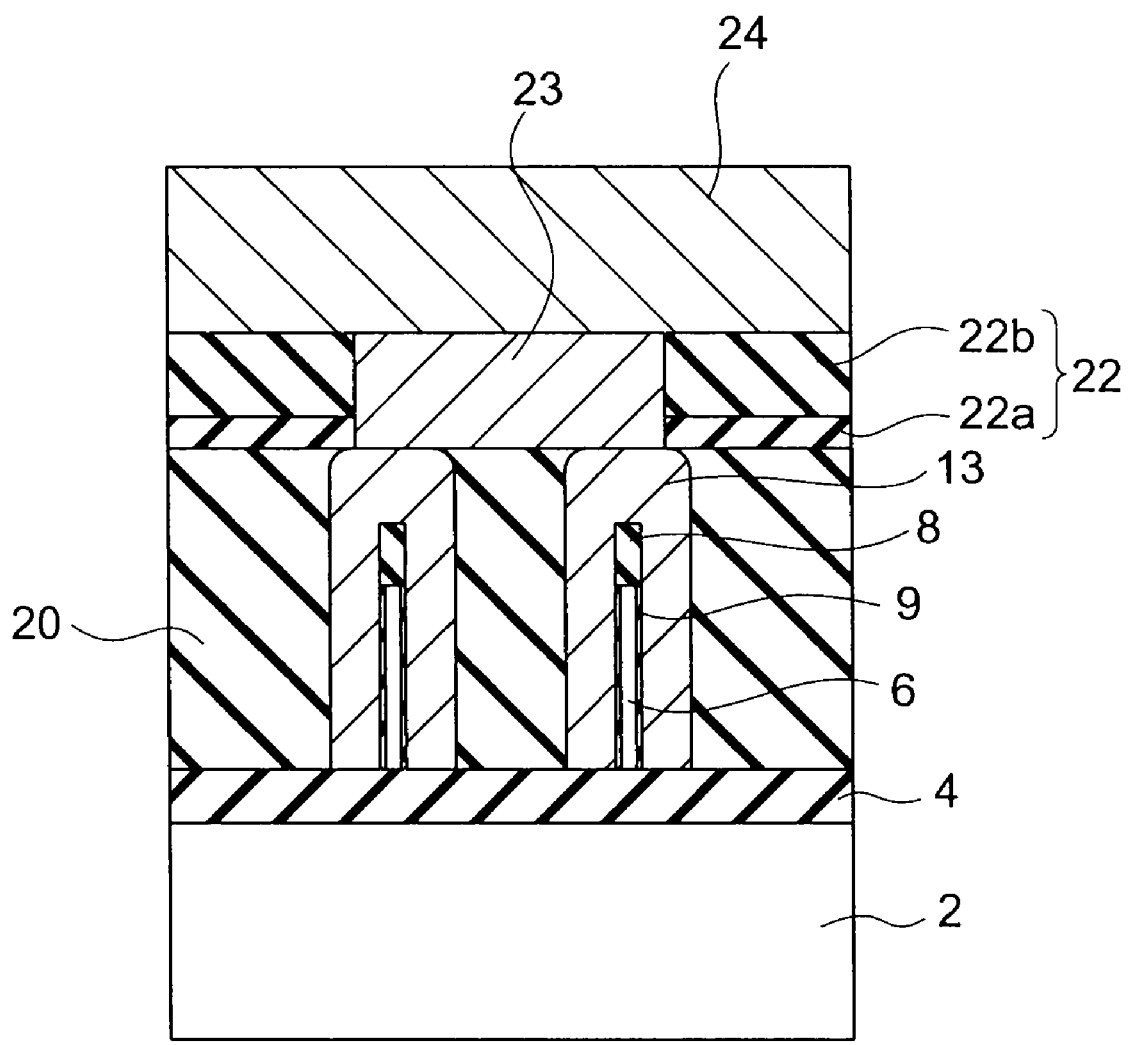

A contact hole (not shown) continuing to the gate electrodes 13 is then formed through the insulating film 22 formed with the interlayer insulating film 22b and the SiN film 22a by a lithography technique and RIE. The contact hole is filled with TiN—W or the like, so as to form a plug 23 (FIG. 16). Further, an interlayer insulating film (not shown) is deposited, and a wire processing groove is formed in the interlayer insulating film by a lithography technique and RIE. This groove is filled with a metal wire 24 made of Al—Cu or the like, so that the gate electrodes 13 are connected to a voltage applying terminal (not shown) via the plug 23 and the metal wire 24 (FIG. 17). Thus, the multi-gate FET of this embodiment is completed.

Figure 18A:
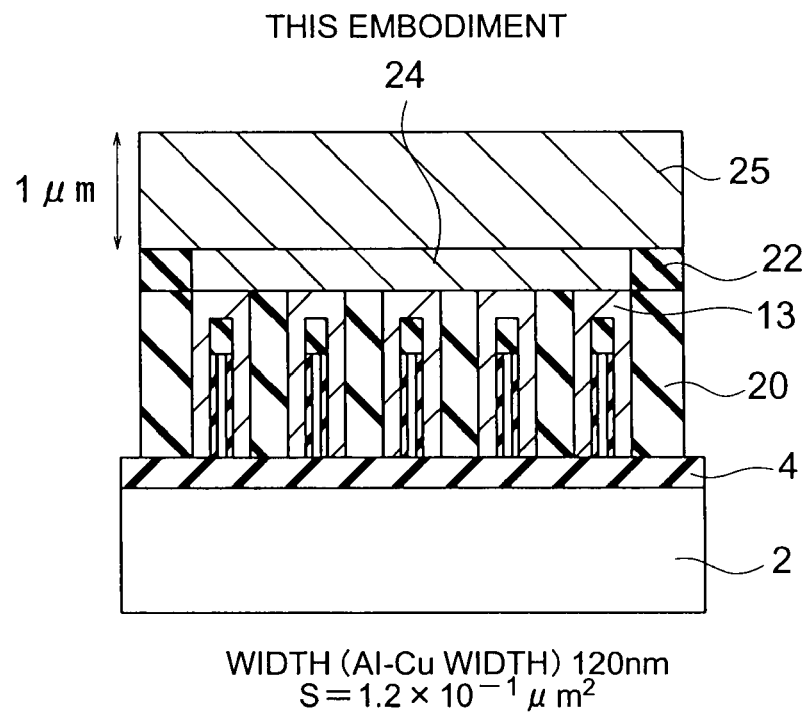
FIGS. 18A and 18B illustrate the effects of the multi-gate FET in accordance with the first embodiment.
Figure 18B:
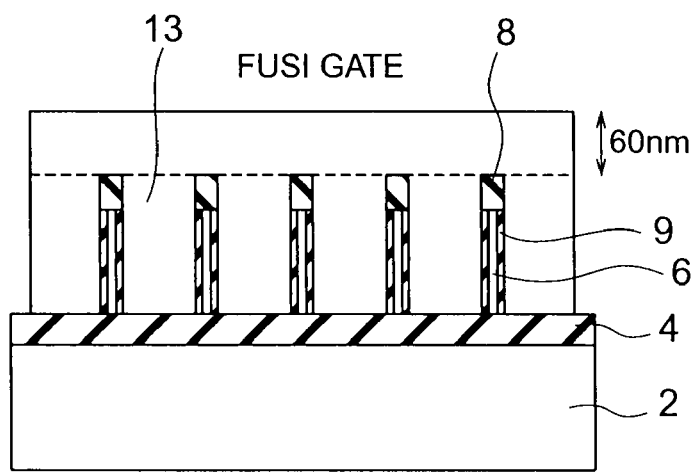

When gate wire resistances are compared between the multi-gate FET of this embodiment formed in this manner and a conventional FUSI-gate Fin FET, signals are transmitted through very thin gate electrodes in the conventional FUSI-gate Fin FET, while signals are transmitted through the thick metal wires 24 in this embodiment. Accordingly, in this embodiment, the adverse influence of the wire resistance on the gate electrodes having high-frequency signals applied thereto during the driving of the transistors can be greatly reduced. For example, where the width (the gate length) is 20 nm, the height of the portion of each FUSI electrode covering the upper portion of each Fin is 60 nm, the width of the Al—Cu wire is 120 nm, and the height of the Al—Cu wire is 1 µm, as shown in FIGS. 18A and 18B, the area S through which signals are transmitted can be increased 100 times or more, and the gate resistance can be further lowered, with the difference in resistivity being taken into consideration.

In this embodiment, the channel protection insulating film 8 may be made of TEOS, the insulating film 19 may be made of SiN, the insulating film 20 may be made of TEOS, and the gate mask material 21 may be made of SiN.

Although the number of fins is two in this embodiment, three or more fins may be employed.

As described above, in accordance with this embodiment, metal contamination can be prevented even after a flattening process is carried out. Also, the gate resistance can be lowered.

Second Embodiment

Figure 19A:
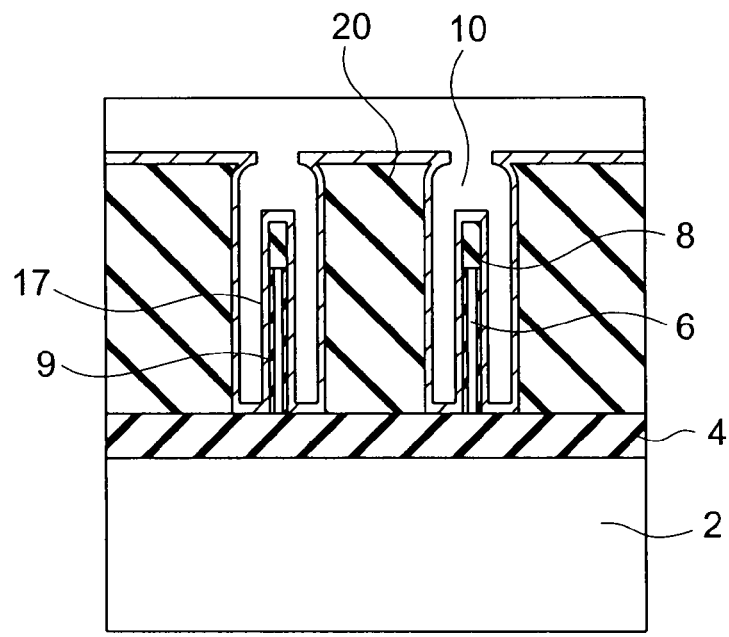
FIGS. 19A to 21D are cross-sectional views illustrating the procedures for manufacturing a multi-gate FET in accordance with a second embodiment of the present invention.
Figure 19B:
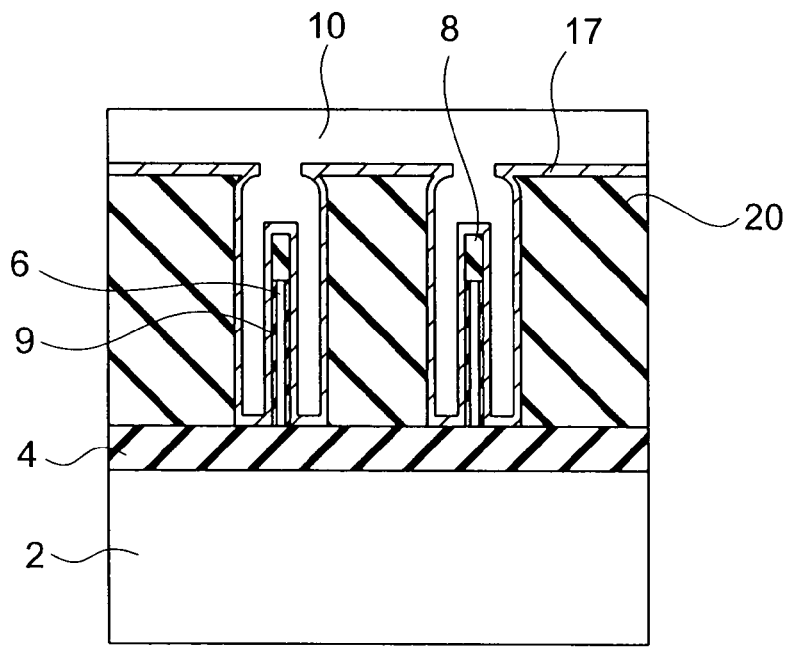
Figure 19C:
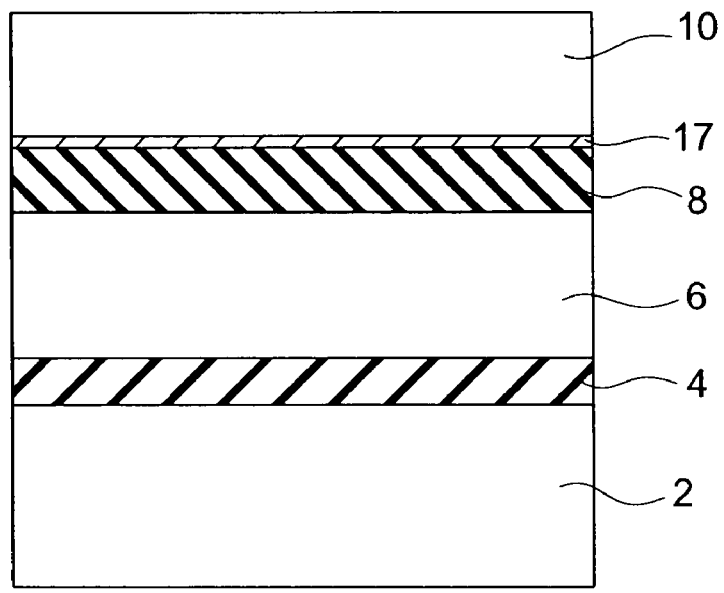
Figure 19D:
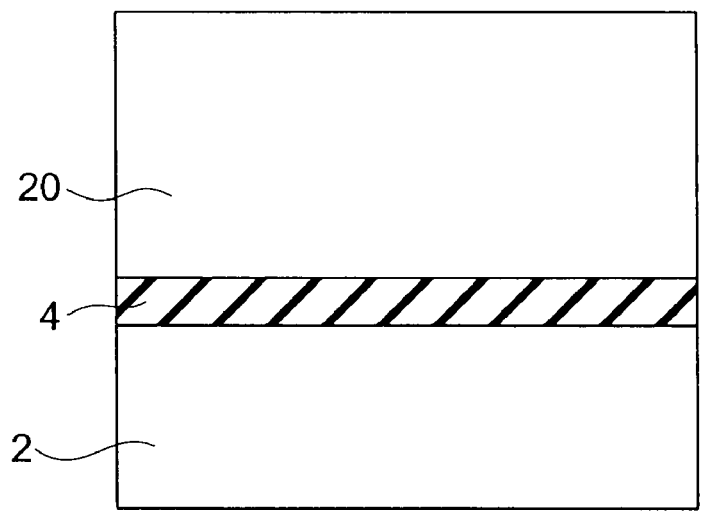
Figure 20A:
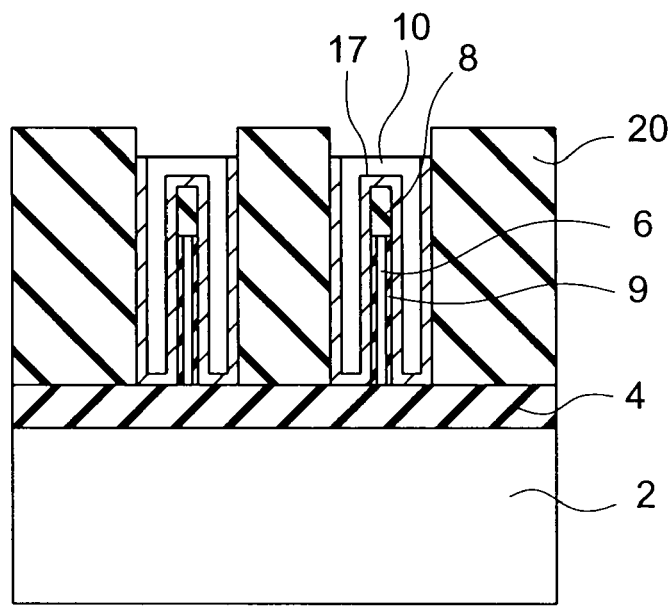
Figure 20B:
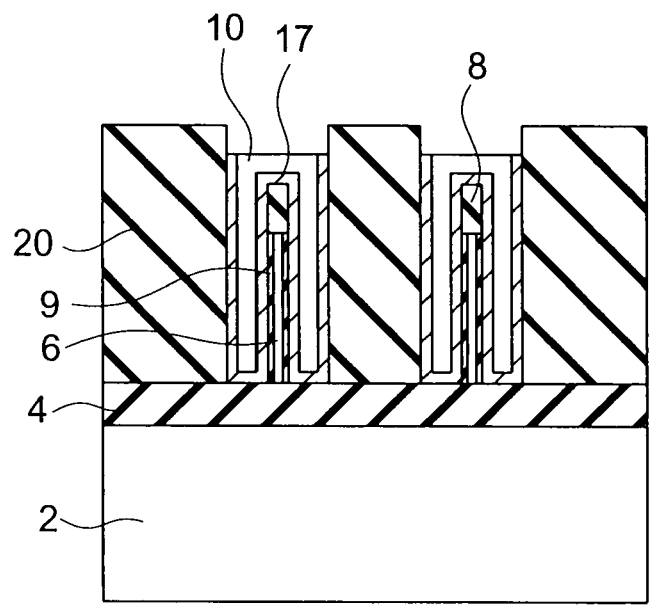
Figure 20C:
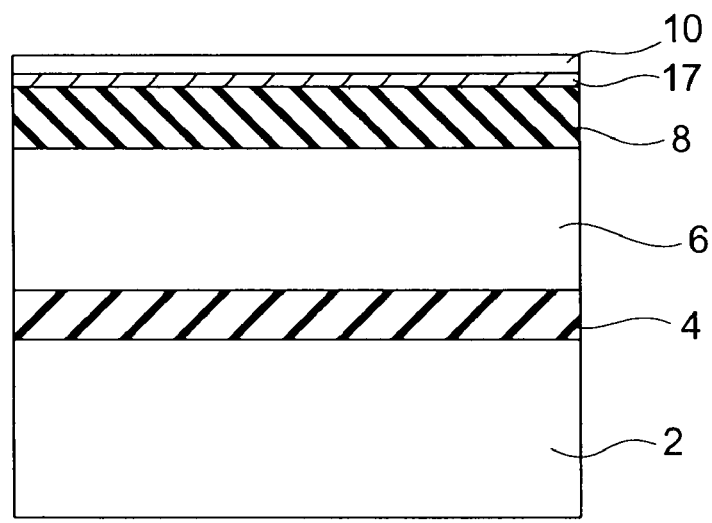
Figure 20D:
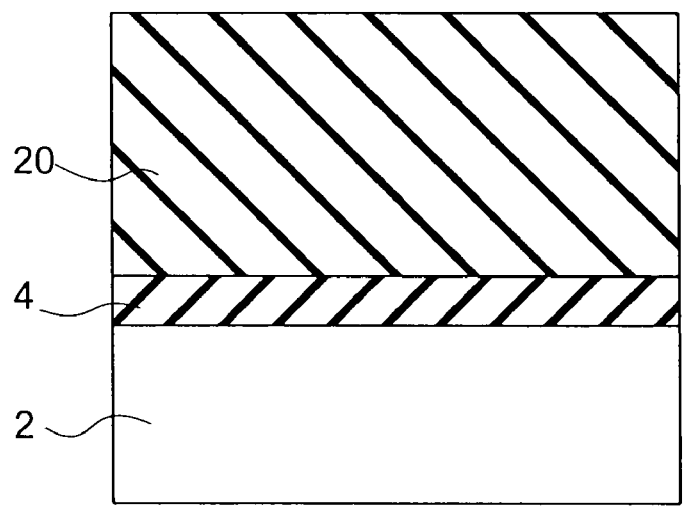
Figure 21A:
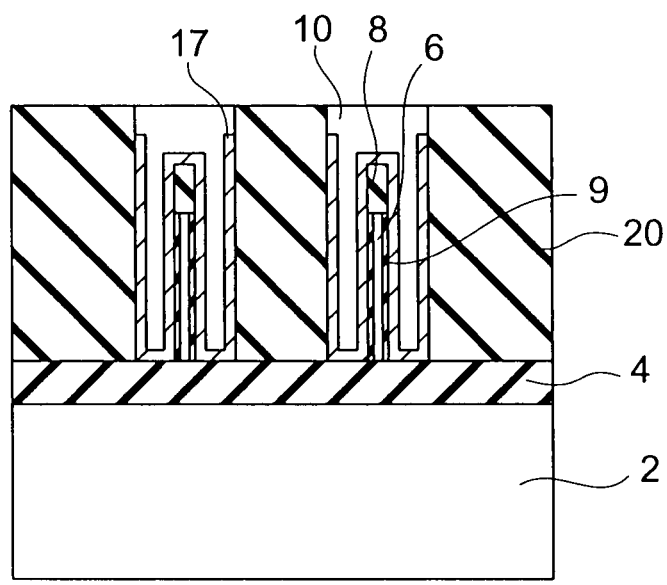
Figure 21B:
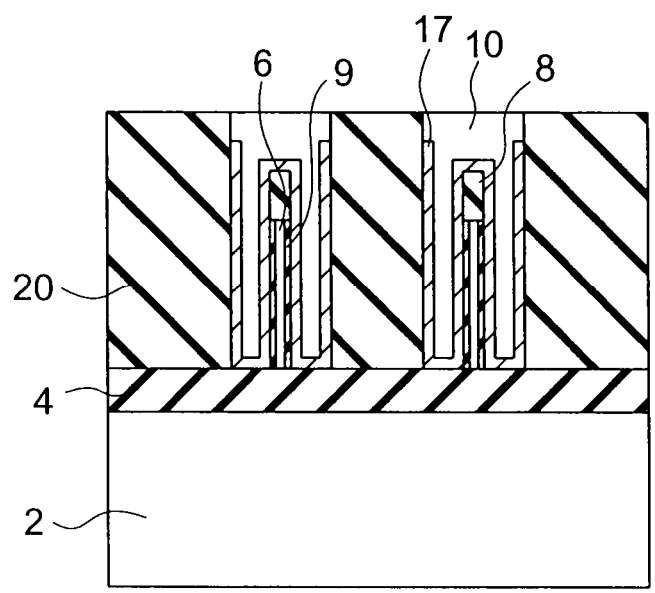
Figure 21C:
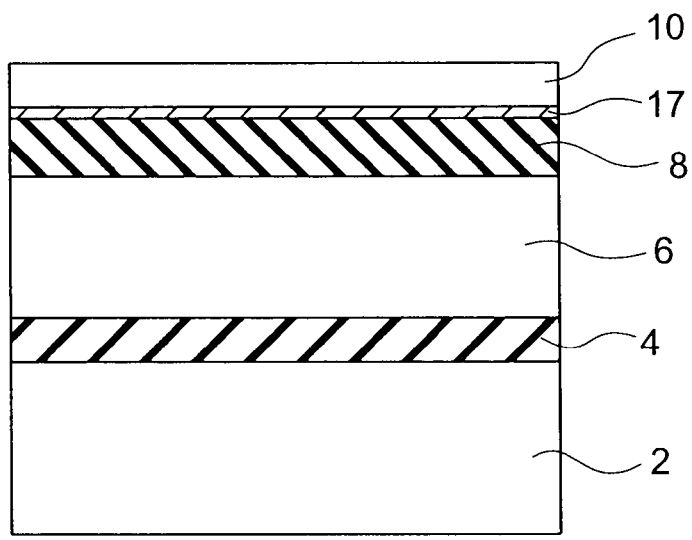
Figure 21D:
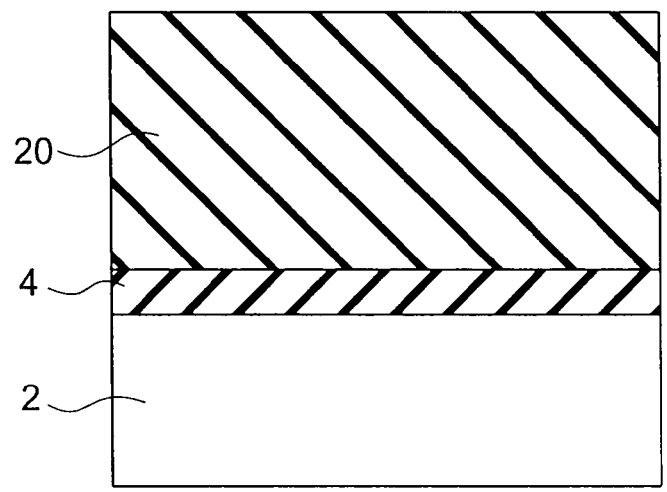

Referring now to FIGS. 19A to 21D, a method for manufacturing a multi-gate FET in accordance with a second embodiment of the present invention is described. The multi-gate FET manufactured by the method in accordance with this embodiment is of a metal-gate type. FIGS. 19A, 20A, and 21A are cross-sectional views of the multi-gate FET, taken along the line A-A' of FIG. 6. FIGS. 19B, 20B, and 21B are cross-sectional views of the multi-gate FET, taken along the line B-B' of FIG. 6. FIGS. 19C, 20C, and 21C are cross-sectional views of the multi-gate FET, taken along the line C-C' of FIG. 6. FIGS. 19D, 20D, and 21D are cross-sectional views of the multi-gate FET, taken along the line D-D' of FIG. 6.

First, the same procedures as the procedures for manufacturing the fully-silicided gate FET of the first embodiment illustrated in FIGS. 7A to 9D are carried out. As shown in FIGS. 19A, 19B, 19C, and 19D, a metal film 17 to be a metal gate is formed by MOCVD (Metal-Organic-Chemical-Vapor-Deposition) on the surfaces of the holes formed by removing the insulating film 19 shown in FIGS. 9A to 9D. The holes are filled with a polysilicon film 10 by LPCVD. At this point, the surfaces of the gate insulating film 9 and the channel protection film 8 inside the holes are covered with the metal film 17 to be a metal gate, and the polysilicon film 10 is formed outside the metal film 17. The metal film 17 to be a metal gate and the polysilicon film 10 also adhere onto the insulating film 20. If CMP is performed in this situation, metal contamination is spread in the entire wafer.

To avoid such a problem, etching is performed on the polysilicon film 10 and the metal film 17, so as to remove the polysilicon film 10 and the metal film 17 from the upper face of the insulating film 20, as shown in FIGS. 20A, 20B, 20C, and 20D. At this point, the semiconductor layers 6 to be the fins and the protection film 8 are covered with the polysilicon film 10, and are not etched by the RIE. Accordingly, the metal film 17 on the upper face of the insulating film 20 can be controlled with efficiency. By taking advantage of the difference in height between the protection film 8 and the buried insulating film 20 measured from the insulating film 4, the metal film 17 and the polysilicon film 10 remain on the side faces of the protection film 8 and the gate insulating film 9.

Figure 22:
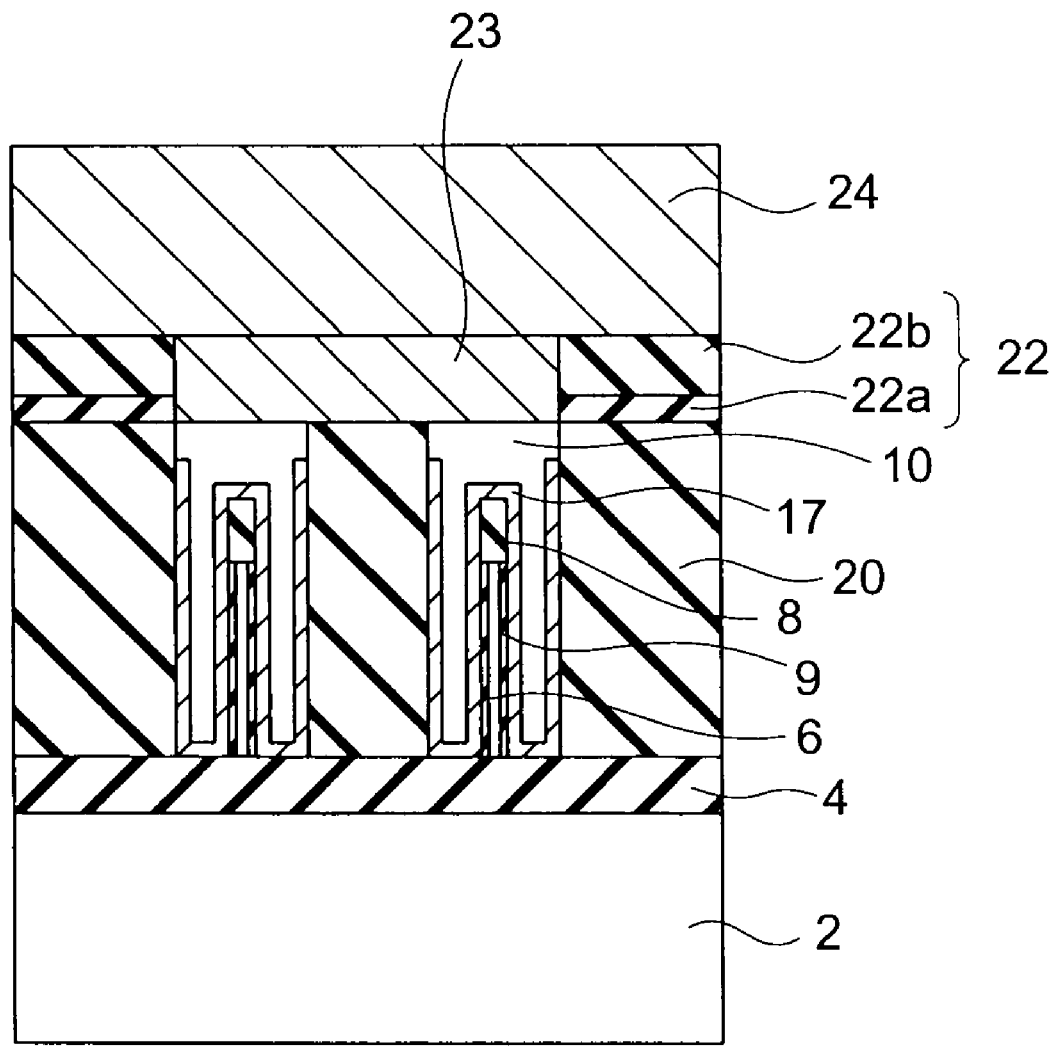
FIG. 22 is a cross-sectional view of the multi-gate FET in accordance with the second embodiment.

As shown in FIGS. 21A, 21B, 21C, and 21D, a polysilicon film 10 is again deposited, and CMP is performed to obtain a flat surface suitable for gate lithographic patterning, without causing metal contamination. After that, the same procedures as the procedures in the first embodiment illustrated in FIGS. 11A to 17 are carried out to complete a multi-gate FET. However, the procedure of forming the polysilicon film 10 illustrated in FIGS. 11A to 11D is unnecessary. The procedure of siliciding the polysilicon film 10 is also unnecessary. FIG. 22 is a cross-sectional view of the multi-gate field effect transistor of this embodiment manufactured in this manner.

In this embodiment, the channel protection insulating film 8 may be made of TEOS, the insulating film 19 may be made of SiN, the insulating film 20 may be made of TEOS, and the gate mask material 21 may be made of SiN, as in the first embodiment.

As described above, in accordance with this embodiment, metal contamination can be prevented even after a flattening process is carried out.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A method for manufacturing a multi-gate field effect transistor, comprising:
    forming a plurality of semiconductor layers in parallel on a substrate;
    forming a protection film on an upper face of each semiconductor layer;
    forming a first insulating layer on the semiconductor layers, the first insulating layer covering side faces of each semiconductor layer and side faces and an upper face of the protection film;
    forming a first interlayer insulating film on an entire surface and flattening the first interlayer insulating film to expose an upper face of each first insulating layer;
    removing the first insulating layers to form a plurality of holes at locations from which the first insulating layers are removed;
    forming a gate insulating film on both side faces of each semiconductor layer inside the holes;
    forming a gate metal film to cover side faces and a bottom face of each hole, the gate insulating film, and the protection film inside the holes;
    forming a polysilicon film to cover the gate metal film;
    etching the polysilicon film and the gate metal film existing in each hole, so as not to expose the gate metal film on the protection film;
    depositing again a polysilicon film to fill each hole;
    flattening the polysilicon film to divide the polysilicon film into a plurality of polysilicon layers and expose an upper face of the first interlayer insulating film;
    forming masks having shapes of gate electrodes on the polysilicon layers;
    patterning the polysilicon layers with the use of the masks;
    forming sidewalls made of an insulator so that the sidewalls sandwich the patterned polysilicon layers in a gate length direction;
    patterning the protection film with the use of the sidewalls to selectively expose an upper face of each semiconductor layer;
    implanting an impurity into the selectively exposed semiconductor layers to form source and drain regions;
    removing the masks to expose an upper face of each polysilicon layer;
    forming a second interlayer insulating film on an entire surface, forming an opening continuing to each of the polysilicon layers on the second interlayer insulating film, and filling the opening to form a metal connecting portion connecting the polysilicon layers; and
    forming a wire connected to the connecting portion.

2. The method according to claim 1, further comprising reducing a height of each of the exposed semiconductor layers by selectively etching the exposed semiconductor layers, prior to the implanting the impurity.

3. The method according to claim 1, wherein the forming the source and drain regions includes implanting the impurity at an angle with respect to a direction perpendicular to a surface of the substrate.

* * * * *